United States Patent [19]
Tokuda et al.

[11] Patent Number: 5,870,289
[45] Date of Patent: Feb. 9, 1999

[54] CHIP CONNECTION STRUCTURE HAVING DIRET THROUGH-HOLE CONNECTIONS THROUGH ADHESIVE FILM AND WIRING SUBSTRATE

[75] Inventors: Masahide Tokuda, Ome; Takeshi Kato, Akishima; Hiroyuki Itoh, Akiruno; Masayoshi Yagyu, Hannou; Yuuji Fujita, Koganei; Mitsuo Usami, Akishima, all of Japan

[73] Assignee: Hitachi, Ltd., Tokyo, Japan

[21] Appl. No.: 572,747

[22] Filed: Dec. 14, 1995

[30] Foreign Application Priority Data

Dec. 15, 1994 [JP] Japan ................................. 6-311518

[51] Int. Cl.$^6$ .............................. H05K 1/14; H05K 1/16; H05K 7/02; H05K 7/06
[52] U.S. Cl. .......................... 361/779; 174/260; 174/261; 174/262; 174/264; 361/760; 361/767; 361/771; 361/783
[58] Field of Search ..................... 29/841, 855; 174/259, 174/260, 261, 262–266; 228/180.21, 180.22; 257/700, 723, 724, 782, 783, 778, 737, 753, 698; 361/760, 767, 768–771, 777, 779, 783, 792, 795, 807, 809; 427/96, 97, 98; 437/203, 209; 439/68, 71, 74, 82, 83; 156/325, 329, 379.8

[56] References Cited

U.S. PATENT DOCUMENTS

| | | | |
|---|---|---|---|
| 5,068,714 | 11/1991 | Seipler | 257/783 |
| 5,406,459 | 4/1995 | Tsukamoto et al. | 361/768 |
| 5,407,864 | 4/1995 | Kim | 257/783 |
| 5,611,884 | 3/1997 | Bearinger et al. | 156/325 |

OTHER PUBLICATIONS

"Multichip Module Technologies and Alternatives: The Basics", New York, Van Nostrand Reinhold, pp. 56–66 and 302–303 (1993).

*Primary Examiner*—Donald Sparks
*Attorney, Agent, or Firm*—Antonelli, Terry, Stout & Kraus, LLP

[57] ABSTRACT

A structure for connecting an integrated circuit chip to a wiring substrate which implements high-density packaging, high-density connection, high-speed signal transmission, and low cost. An integrated circuit is connected to a wiring substrate by means of flip-chip die bonding using an adhesive film. A direct through-hole connection is formed directly below a connecting pad so as to pass through the adhesive film and the wiring substrate. This direct through-hole connection directly connects the connecting pad to the wire. As a result of reduced area and thickness of the chip, the chip is mounted in high density, and high-density inputs and outputs are implemented by means of minute two-dimensional connections. Short wire connections directly connected to the chip permit high speed signal transmission, and high reliability is ensured by the dispersion of stress. Low-cost packaging can be effected by simple processes and facilities.

33 Claims, 11 Drawing Sheets

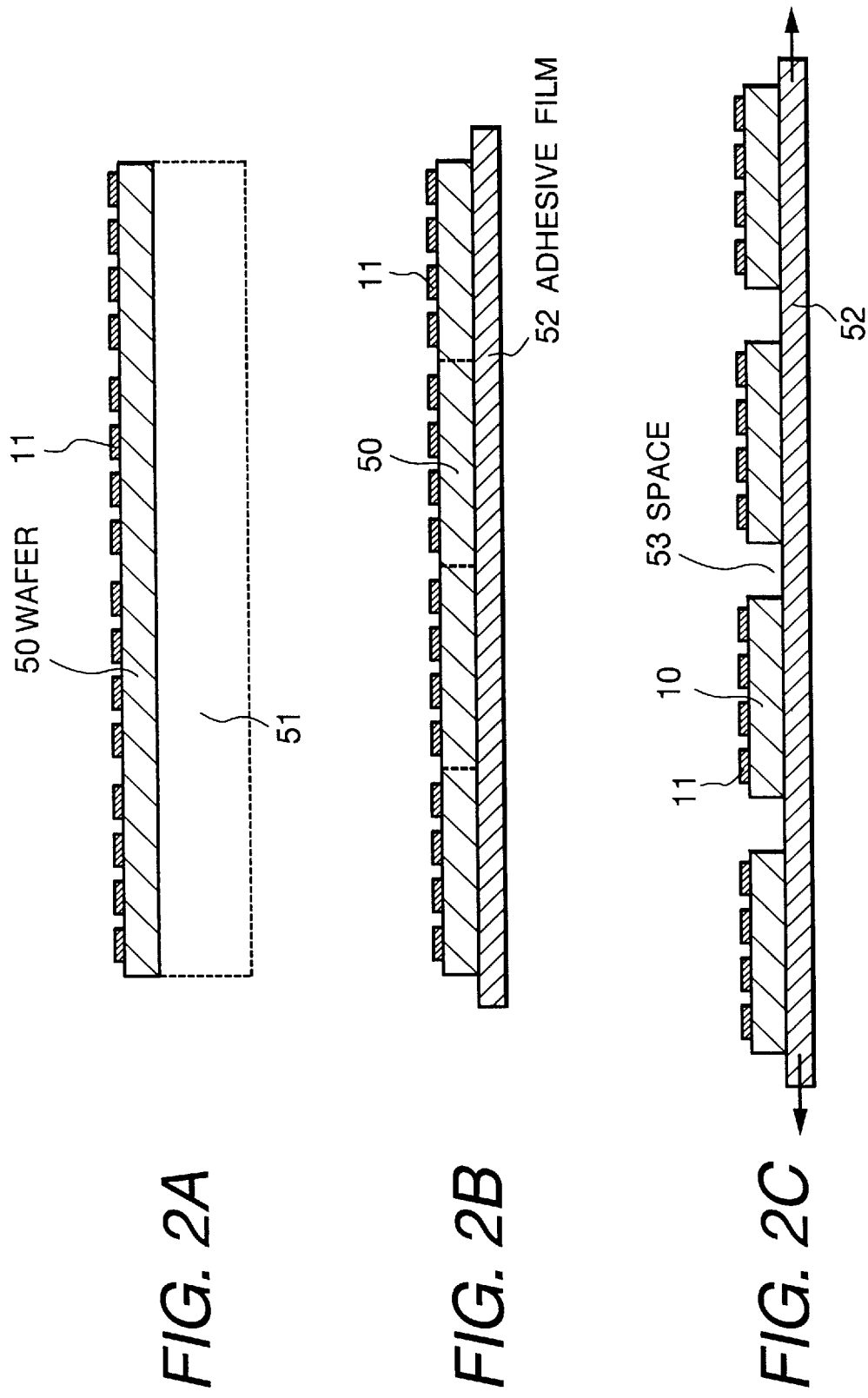

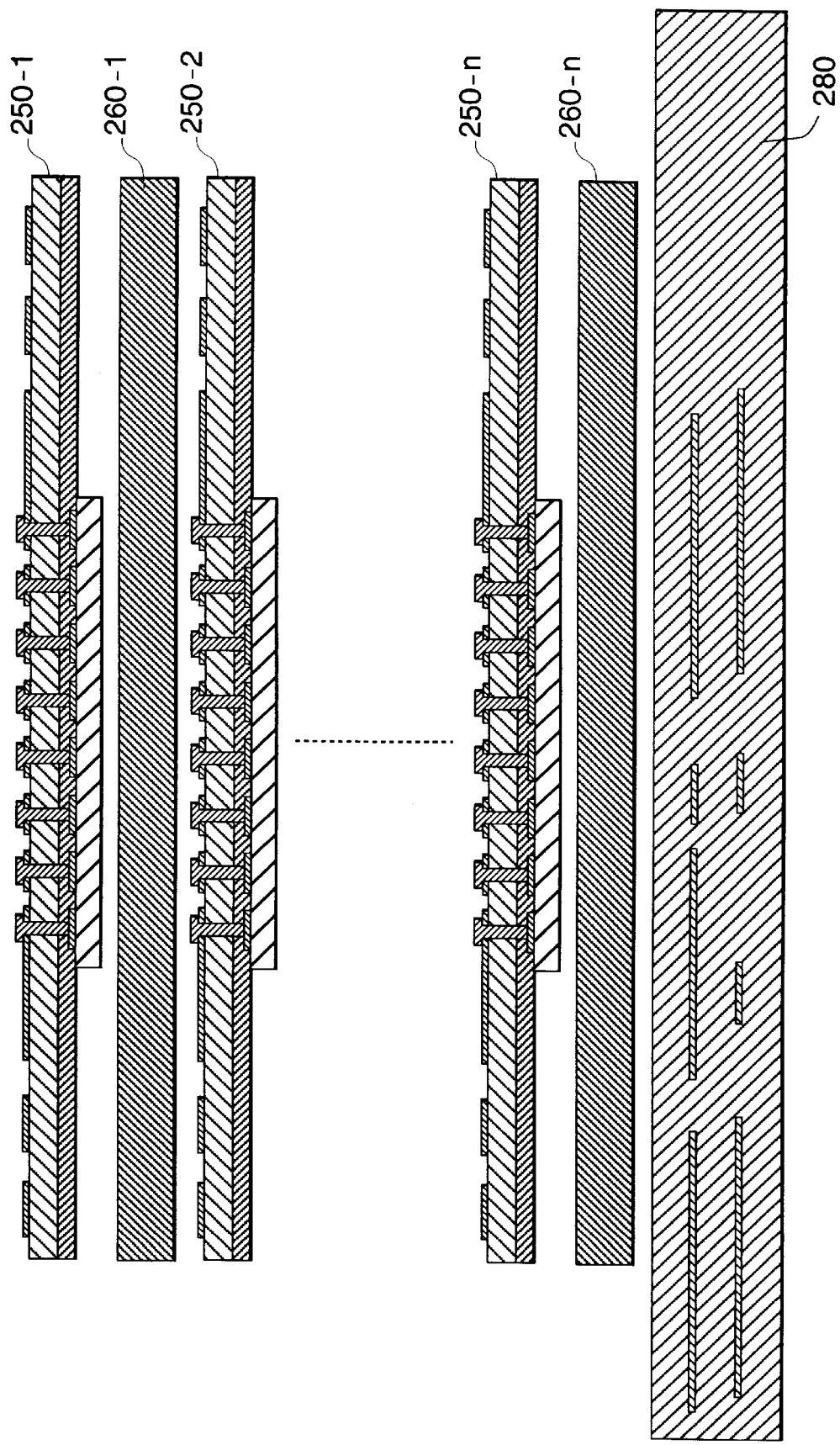

271 THROUGH-HOLE

CHIP CONNECTION STRUCTURE HAVING DIRET THROUGH-HOLE CONNECTIONS THROUGH ADHESIVE FILM AND WIRING SUBSTRATE

BACKGROUND OF THE INVENTION

This invention relates to a connection structure between an integrated circuit chip and a wiring substrate and, more particularly, to a chip connection structure suitable for use in high-density, high-performance and low-cost packaging.

Conventional technologies for connecting an integrated circuit chip to a wiring substrate are disclosed in, for example, "Multichip Module Technologies and Alternatives: The Basics", New York, Van Nostrand Reinhold, pp. 56–66, 302–303, 1993.

Wire bonding (WB), Tape Automated Bonding (TAB), Flip Chip Solder Bump (FCSB), and High Density Interconnections (HDI) are widely known as representative chip connection technologies.

WB is a technology used for connecting an integrated circuit to a wiring substrate using a metal wire. This technology is the oldest and has been most widely used. According to above-mentioned references, for instance, a bonding pad 711 laid along the periphery of a chip 710 is connected to a bonding pad 713 of a substrate 714 by a wire 712, as shown in FIG. 7A.

TAB is a technology for connecting a chip to a substrate using a TAB tape. As shown in FIG. 7B, an inner lead 723 of a TAB tape 724 is connected to a bump 722 formed on an I/O pad 721 along the periphery of a chip 720. An outer lead 725 of the tape 724 is connected to an I/O pad 727 of a substrate 726. TAB makes it possible to connect a chip on smaller pitches and to provide a larger number of pins, compared with WB. The tape automated bonding is the second most popular technology, after WB.

FCSB is a technology for connecting a chip to a substrate using a spherical solder bump. As shown in FIG. 7C, a chip 730 is mounted on a substrate 734 with its circuit side facing down. An I/O pad 731 of the chip 730 and an I/O pad of the substrate 734 are connected together by a solder bump 732. FCSB can implement area array layout as well as layout along the periphery of the chip 730. Compared with TAB, FCSB is used for high-speed chip connection with a larger number of pins.

HDI is a technology for laminating a thin film wiring on the surface of a chip and the substrate. As shown in FIG. 7D, a chip 740 is mounted inside a cavity 749 formed in a substrate 748. Insulating films 742 and 744 are laid on top of the other on the surface of the chip 740 and the substrate 748, and via-holes 746, 747 and wires 743, 745 are formed in turn. An I/O pad 741 of the chip 740 and wires 743, 745 are connected together by the via-holes 746, 747. HDI is used for high-speed chip connection on smaller pitches.

There is a strong demand for improved cost-performance and downsizing in many processors, from a high-speed computer to a portable terminal equipment. Particularly in the case of memory, a lot of packing area is occupied by substrates and cards which form hardware. The realization of a smaller and less expensive memory module having a larger capacity is a very important problem facing designers. Further, in the field of an IC card and personal equipment, a reduction in thickness as well as in size is demanded.

Associated with these demands, an improved packaging density, improved electrical and mechanical performance, and reduced costs for facilities and packaging are more required. There is a tendency for microprocessor chips and memory chips such as, dynamic random access memory, and static random access memory to be increased in speed, size and the number of pins. It is required to address the previously mentioned problems based on this tendency.

As mentioned in detail in the above listed literature, the conventional chip connection technologies have both merits and demerits with respect to the above described problems. They may solve one problem but are not suitable for solving the other problem. In this way, the conventional solutions to the problems are in a trade-off relationship with each other.

Of the prior art technologies, WB and TAB are disadvantageous with respect to packaging density, that is, they require a larger packaging area compared with the packaging area needed by FCSB and HDI. As shown in FIG. 7, a bonding area for a wire 712 is additionally needed in the surrounding of a chip 710 in addition to a footprint of the chip itself. TAB requires a tape area 724 between an inner lead 723 and an outer lead 725, and a bonding area for an outer lead 725, as shown in FIG. 7B. TAB usually requires a larger packaging area than the packaging area of WB.

To increase packaging density in a thicknesswise direction, attempts have been made to reduce the thickness of a chip itself by chemical etching or mechanical polishing. However, WB requires a predetermined thickness for bending a wire (the wire 712 shown in FIG. 7A), and FCSB also requires a predetermined thickness for a solder bump (a bump 732 shown in FIG. 7C). Therefore, these two technologies are not suitable for reducing the thickness of the package.

Compared with FCSB and HDI wherein a chip and a wiring substrate are two-dimensionally connected together along the surface of the chip, WB and TAB have a limit to the number of connections because the chip and the wiring substrate are connected together along the periphery of the chip. In consideration of the large packaging area, WB and TAB are disadvantageous in view of a connection density.

Compared with FCSB and HDI, WB and TAB are not suitable for high-speed signal transmission with regard to electrical performance. In the case of WB and TAB, the length of a connection between pads of a chip and pads of a substrate becomes longer, as can be seen from FIGS. 7A and 7B, whereby resistance and inductance become larger. If short TAB or two-layer TAB is used in lieu of conventional single-layer TAB, better performance will be obtained. However, it may require a higher cost.

FCSB requires careful design compared with the other technologies with respect to mechanical performance, particularly, reliability against thermal stress and external stress. In the case of WB and TAB, it is possible for the wire 712 and the tape 724, shown in FIGS. 7A and 7B, to absorb stress. In the case of FCSB, stress concentrates on solder bumps 732, shown in FIG. 7C, and particularly on the bumps arranged along the outer periphery of the chip. In the worst case, the bumps may fracture. To reinforce the bumps, a space between bumps is filled with resin, which incurs extra process cost.

WB is most inexpensive in view of cost. On the other hand, TAB, FCSB, and HDI are expensive with respect to costs for facilities and connection process. A facility for TAB which performs connection on small pitches is very expensive. Infrastructure, such as chips or facilities, for FCSB is not yet established, and the automation of FCSB is not as well implemented as with WB and TAB. TAB and FCSB require a process for forming bumps on a chip or a substrate, and hence a chip requires special design. TAB further incurs the cost for producing a tape. HDI needs a laborious process for laying films 742, 744 and wires 743, 745, on top of the other, on the surfaces of the chip and the substrate, as shown in FIG. 7D. Reworking of HDI is very difficult and complicated, and therefore HDI is the most expensive among the conventional technologies.

The conventional representative chip connection technologies have been described above. The conventional technologies have their own merits, and variations on the conventional technologies are also conceivable. However, none of them provides a totally satisfactory solution to our challenges.

SUMMARY OF THE INVENTION

This invention is conceived to solve the problems of the conventional technologies and to provide a chip connection technology which implements high density, high performance, and low cost. Specifically, the present invention has the following objects and means for realizing the objects which will be described later.

(1) A first object of the present invention is to provide a fundamental chip connection structure which provides a reduced packaging area of an integrated circuit on a wiring substrate when compared with the packaging area of the integrated circuit required by WB and TAB, a package having a reduced thickness compared with the thickness of a package produced by WB and FCSB, a plurality of inputs and outputs compared with the inputs and outputs obtained by WB and TAB, a capacity for transmitting a faster signal compared with the transmission capacity of a package obtained by WB and TAB, ensured reliability more easily compared with the reliability obtained by FCSB, and reduced costs for facilities and processes compared with the cost required by TAB, FCSB, and HDI.

(2) In addition to the first object, a second object of the present invention is to provide means for easily coupling connecting pads of a chip to wires of a substrate in an inexpensive manner.

(3) In addition to the first object, a third object of the present invention is to provide a substrate material suitable for the chip connection structure and material for use in bonding the chip to the substrate.

(4) In addition to the first object, a fourth object of the present invention is to provide a material composition which facilitates bonding.

(5) In addition to the first object, a fifth object of the present invention is to provide a connection between a pad and a substrate which is suitable for the size of a pad.

(6) In addition to the first object, a sixth object of the present invention is to provide a connection suitable for the size of a substrate.

(7) In addition to the first object, a seventh object of the present invention is to provide a connection between a substrate and a wiring which is suitable for high-speed signal transmission.

(8) In addition to the first object, an eighth object of the present invention is to provide a substrate having improved reliability with respect to an ambient temperature.

(9) In addition to the first object, a ninth object of the present invention is to provide bonding having improved reliability with respect to temperatures and external forces.

(10) In addition to the first object, a tenth object of the present invention is to provide a substrate and a wiring suitable for reducing a chip connection cost and the thickness of the chip.

(11) In addition to the tenth object, an eleventh object of the present invention is to provide an inexpensive high-speed signal wiring to use, for example, in a chip having a relatively small density of wires and connections.

(12) In addition to the tenth object, a twelfth object of the present invention is to provide a high-speed signal wiring to use, for example, in a chip having a relatively large density of wires and connections.

(13) In addition to the first object, a thirteenth object of the present invention is to provide an inexpensive substrate to use, for example, in a chip having a relatively large density of wires and connections.

(14) In addition to the first object, a fourteenth object of the present invention is to provide means for manufacturing a thin chip.

(15) In addition to the fourteenth object, a fifteenth object of the present invention is to provide means for easily manufacturing an ultrathin chip.

(16) In addition to the first object, a sixteenth object of the present invention is to provide means for packaging a chip and a substrate into a single thin unit.

(17) A seventeenth object of the present invention is to provide a fundamental chip connection structure which provides a further improved packaging density with respect to a substrate area and enables a thin package, a high-speed signal transmission capability, ensured reliability, and controlled costs.

(18) In addition to the seventeenth object, an eighteenth object of the present invention is to provide packaging means which requires a small packaging area, for example, in the case of a chip having a relatively large number of input and output pins.

(19) In addition to the eighteenth object, a nineteenth object of the present invention is to provide means for taking a number of input and output pins out of a package.

(20) In addition to the seventeenth object, a twentieth object of the present invention is to provide thin and inexpensive packaging means.

(21) In addition to the seventeenth object, a twenty-first object of the present invention is to provide a chip structure suitable for high-density packaging.

(22) In addition to the twenty-first object, a twenty-second object of the present invention is to provide a chip structure having a high functionality.

(23) In addition to the seventeenth object, a twenty-third object of the present invention is to provide a chip structure suitable for high-speed signal transmission and receipt.

(24) In addition to the seventeenth object, a twenty fourth object of the present invention is to provide means for suppressing power supply noise.

(25) In addition to the seventeenth object, a twenty fifth object of the present invention is to provide means for preventing a rise in temperature of a chip.

These objects are attained by respective means which will be described below.

(M1) The first object is achieved by bonding an integrated circuit chip to a wiring substrate using an adhesive film by means of flip chip die bonding (hereinafter referred to as FCDB), and by connecting pads to wiring of a substrate by means of a direct through hole connection (hereinafter referred to as DTC), that is, by forming a through hole directly below the connecting pads of the chip into the adhesive film and the wiring substrate.

(M2) Similarly to the first object, the second object is achieved by DTC which results from coupling connecting pads to wiring by plating through holes formed directly below the connecting pads.

(M3) Similarly to the first object, the third object is achieved by use of polymer base materials for a wiring substrate and an adhesive film.

(M4) Similarly to the first object, the fourth object is achieved by use of a polymer possessing high-temperature fluidity and thermosetting properties for the adhesive film.

(M5) Similarly to the first object, the fifth object is achieved by the fact that the diameter of the DTC is less than the size of a pad.

(M6) Similarly to the first object, the sixth object is achieved by the fact that the thickness of the wiring substrate is less than half the diameter of the DTC.

(M7) Similarly to the first object, the seventh object is achieved by forming a wiring made of copper and DTCs on a polyimide wiring substrate having a low dielectric constant.

(M8) Similarly to the first object, the eighth object is achieved by the fact that the wiring substrate is substantially the same in thermal expansion coefficient as the chip.

(M9) Similarly to the first object, the ninth object is achieved by the use of an adhesive film which is softer than the chip and the substrate.

(M10) Similarly to the first object, the tenth object is achieved by the use of a wiring substrate made of a single layer film, and by laying a wire at least on one side of the wiring substrate.

(M11) Similarly to the first object, the eleventh object is achieved by forming a coplanar signal line on the opposite side of the wiring substrate to the chip.

(M12) Similarly to the eleventh object, the twelfth object is achieved by forming a feed line on one surface of the wiring substrate and a microstrip signal line on the other surface of the wiring substrate.

(M13) Similarly to the first object, the thirteenth object is achieved by the use of a multilayer wiring film or a multilayer printed substrate for the wiring substrate.

(M14) Similarly to the first object, the fourteenth object is achieved by thinly processing the chip from its rear surface side using mechanical polishing or chemical etching.

(M15) Similarly to the fourteenth object, the fifteenth object is achieved by the use of a silicon-on-insulator chip for the chip.

(M16) Similarly to the first object, the sixteenth object is achieved by forming input and output leads to be connected to wiring resulting from covering at least a part of an adhesive film and a chip.

(M17) The seventeenth object is achieved by the steps of stacking a plurality of chip carriers one on top of the other using a first adhesive film, and connecting the chip carriers together using through-hole connections which pass through the chip carriers and the first adhesive film. In each chip carrier, chips and a wiring substrate are connected to each other by means of FCDB using a second adhesive film, and connecting pads and wiring of the substrate by means of DTC.

(M18) Similarly to the seventeenth object, the eighteenth object is achieved by steps of bonding the chip carrier to a package base using a third film, connecting the chip carriers to the input/output pins via the through-hole connections connected to the second wiring, and coating the chip carriers and at least a part of the package base.

(M19) Similarly to the eighteenth object, the nineteenth object is achieved by the use of a ball-grid array for the input/output pins.

(M20) Similarly to the seventeenth object, the twentieth object is achieved by providing a chip connection structure with input/output leads, and covering the chip carriers and a part of the input/output leads.

(M21) Similarly to the seventeenth object, the twenty-first object is achieved by forming at least one of the chips from a memory chip.

(M22) Similarly to the twenty-first object, the twenty-second object is achieved by forming at least one of the remaining chips from a microprocessor chip.

(M23) Similarly to the seventeenth object, the twenty-third object is achieved by providing at least one chip with a terminating resistor circuit.

(M24) Similarly to the seventeenth object, the twenty-fourth object is achieved by laying a capacitor film at the upper, lower, or middle portion of the stack of the chip carriers.

(M25) Similarly to the seventeenth object, the twenty-fifth object is achieved by laying a thermally conducting substrate at one of the upper, lower, and middle portions of the stack of the chip carriers.

In the fundamental chip connection structure realized by the first object, an integrated circuit chip is mechanically bonded to a wiring substrate by FCDB, and connecting pads of the chip are directly connected to wiring on the wiring substrate by DTC. FCDB and DTC are not included in any of the conventional technological categories, that is, WB, TAB, FCSB, and HDI. In this way, a new chip connection structure is implemented.

The packaging area required by FCDB is equal to the size of the footprint of the chip itself. DTC is carried out directly below the chip, and hence the bonding area required by WB or the tape area required by TAB become unnecessary.

DTC is formed in a wiring substrate and a very thin adhesive film, and hence the height from the surface of the substrate to the rear surface of the chip becomes substantially equal to the thickness of the chip. Unlike a bend used in WB or a bump used in FCSB, DTC does not require an excessive height.

Further, DTCs are formed on approximately the same pitches as the pitches of HDIs. DTCs are two-dimensionally drawn out of the overall surface of the chip, and hence there is no limit to the number of connections compared with WB and TAB in which the four sides of a chip are used for connection. DTC stands comparison with FCSB and HDI in terms of a signal transmission performance. In the case of DTC, connecting pads are directly connected to wiring, and hence DTC produces neither increased resistance nor increased inductance unlike WB and TAB which require a longer connection.

In the case of FCDB, the overall surface of the chips is fixed to the substrate by an adhesive film, and hence neither thermal stress nor external stress concentrates in DTC. Therefore, unlike bumps used in FCSB, FCDB does not bring about any fractures.

DTC is formed by metallizing through-holes formed through the substrate and the adhesive film using inexpensive process which is commonly used in the process of manufacturing a printed wiring substrate. An adhesive film for use in FCDB is fed together with a substrate, and hence the feeding of a separate tape needed in TAB becomes unnecessary. The connection between the bonding pads and the wiring is completed at the same time that the DTC is metallized. Hence, unlike TAB and FCSB, it becomes unnecessary to effect two-stage processing such as the formation of bumps and the connection of a chip to the bumps. A wiring to be connected to DTC is previously formed on a substrate, and therefore it is unnecessary to deposit a wiring layer on the chips and the substrate.

In the second means M2, the chips fixed to the substrate by FCDB are immersed into a plating solution bath so as to metallize the through-holes, whereby DTC is formed. DTCs do not require such expensive facilities as used when forming a bump by vapor deposition using TAB and FCSB. The throughput of batch processing is not restricted.

In the third means M3, the chips are mounted on a printed wiring substrate or a polymer laminated substrate such as a flexible wiring film by means of a polymer adhesive film. The polymer base material is industrially in widespread use. No special infrastructures are necessary to effect bonding of FCDB or to process through-holes formed by DTC before and after the bonding of FCDB. The polymer provides a wide range of design of materials compared with a thick-film ceramics substrate and a silicon substrate by utilization of mixing and addition. Further, a polymer adhesive film has an insulating property, and hence DTC will not bring about a short circuit compared with the case where FCDB is carried out using solder. In the fourth means M4, the adhesive film is deformed by heating, and the adhesive film fits well with the flip chips mounted on the substrate. The adhesive film sets by its thermosetting properties, and FCDB is carried out. When the adhesive film is fed over the substrate prior to FCDB, the adhesive film is not in flux unlike the common liquid adhesive. Therefore, dripping of the adhesive does not occur.

In the fifth means M5, DTCs are formed. Otherwise, the connecting pads are positioned in alignment with the positions where DTCs are to be formed, and chips are fixed to a substrate. Unlike the case where the diameter of DTC is equal to the size of the pad, positioning tolerance will not become smaller. The formation of DTC will neither degrade the passivation of the chip around the pads nor bring about shorting of adjacent DTCs.

In the sixth means M6, DTC having an aspect ratio of less than 2 is formed on a substrate. Unlike a connection having a large aspect ratio, it is not difficult to metallize the deep inside the through-hole, and therefore a connection failure between the pad and the wiring will not occur. In the seventh means M7, input/output signals of the chip are transmitted through the copper/polyimide substrate. This substrate has a lower dielectric constant than that of an epoxy substrate or a ceramic substrate, and it also has a smaller wiring resistance than that of tungsten or molybdenum. Accordingly, a transmission delay and attenuation of the signal are prevented.

In the eighth means M8, the substrate material is selected in such a way as to become similar to the chip in terms of a thermal expansion coefficient. Low thermal expansion fillers may be mixed into the substrate material, as required. Stress developing as a result of a difference in thermal expansion between the chip and the substrate is alleviated, and hence the peeling of FCDB and the break of DTC resulting from fatigue continued over a prolonged period will not occur.

In the ninth means M9, material having low rigidity is selected for the adhesive film. The adhesive film absorbs thermal stress developed as a result of variations in temperature and stress applied from the outside, whereby the stresses are alleviated. Therefore, neither FCDB nor DTCs are broken.

In the tenth means M10, a single layer film having its surface previously wired is subjected to FCDB. The single layer film is thin and flexible, and hence it is not necessary to increase the thickness of the film to retain mechanical strength unlike a thick-film ceramic substrate and a thin-film silicon substrate. Furthermore, unlike a multilayer film substrate, it is not necessary to align layers with each other, and a large or long film becomes available.

In the eleventh means M11, an exposed coplanar wiring is provided below the wiring film, that is, at the bottom surface of the chip connection structure which has been subjected to FCDB and provided with DTCs. A feed line is provided between signal lines, and therefore crosstalk between the signal lines is reduced. Unlike the case where a wiring is formed on an adhesive film side of a chip, it is not necessary to form through-holes which communicate from the adhesive film side to the opposite side of the chip for inspection of the chip and connection of input/output pins.

In the twelfth means M12, a microstrip signal wiring layer and a feed layer are provided on both sides of the wiring film. The reference plane is in the vicinity of the signal wiring, and therefore crosstalk between the wiring films is prevented. Further, unlike the coplanar wiring, it is not necessary to provide the feed line between the signal lines, and therefore it is not necessary to extend the line pitch.

In the thirteenth means M13, DTCs are connected to a plurality of wiring layers of the substrate. Unlike the single layer film, the number of wiring and DTCs connected to the wiring is not limited.

In the fourteenth means M14, the rear surface of the chip is removed by etching or polishing. Unlike the case where a chip separated from a wafer is directly used, the chip will not become thick because of its portions irrelevant to circuit operation are removed.

In the fifteenth means M15, the silicon-on-insulator chip is chemically etched, except for an active layer and an insulator layer thereof. The insulator layer acts as an etch stopper, and hence it becomes unnecessary to precisely control the thickness of the chip.

In the sixteenth means M16, the chip is packaged by encapsulating the chip and the adhesive film surrounding the chip. As a result of this, it is unnecessary to house the chip in a separate package, which in turn contributes to a reduced number of parts and prevents an increase in thickness of the package. In the seventeenth means M17, the chip is bonded to a chip carrier substrate by FCDB, and connecting pads of this chip are connected to a wiring of the substrate by DTC. The chip carriers are stacked one on top of the other in layers, and the carriers are connected to each other by through-hole connections.

In this structure, the chip carriers are stacked up, and hence they only needs a footprint for one chip carrier as a packaging area. The through-hole connections are formed by forming through-holes which pass vertically through the stacked carriers, and by metallizing the through-holes using a common method. If a thin carrier substrate having a relatively small amount of wiring is used, the height of the overall laminate structure will be smaller. As a result of this, the diameter of the through-hole is smaller, and hence wiring between the DTCs to the through-hole connection does not become longer.

In the eighteenth means M18, input/output pins are drawn out of the package base at the bottom of the stacked chip carriers. Connecting pads of the chips are connected to the input/output pins by way of DTCs, the wiring of the carrier substrate, the through-hole connections, and the wiring of the package base. The input/output pins are arranged on the rear surface of the package base, and hence it is not necessary to increase a packaging area unlike the case where input/output pins are arranged along the outer periphery of the laminate structure. As a result, the number of pins of the package will not be limited.

In the nineteenth means M19, the chip receives inputs and sends outputs through solder balls arranged in a grid pattern on the rear surface of the package base. The solder ball can contribute to reduced connection pitch compared with a needle-shaped pin. A printed substrate can be used for a base, and hence a cost of the substrate can be reduced, unlike a ceramic pin grid array.

In the twentieth means M20, leadframes are connected to a carrier substrate positioned on the front or rear layer of the laminate structure, and the leadframes are coated for packaging. The height of the overall package structure depends on the thickness of the chip carrier and the coating. Therefore, the height will not be increased by other constituent parts such as a package base, or the like. The reduced number of parts contributes to a reduction in unnecessary costs.

In the twenty-first means M21, address lines and data lines are wired to the memory chips on each layer through the pads, DTCs, the wiring on the substrate, and the through-hole connections. Memory devices share wiring with each other, and hence the amount of wiring routed on the substrate becomes smaller. For this reason, a thin substrate is used. Further, the laminate structure becomes thin, and the diameter of the through-hole connections and the pitches between the through-hole connections become smaller. Unlike the case where chips on each layer have different wiring, it is possible to prevent an increase in the packaging area of the laminate structure resulting from increased thickness of the substrate, and to prevent an increase in the area for through-hole connections associated with the increased thickness.

In the twenty-second means M22, memory chips and microprocessor chips are stacked up. The memory chips are arranged directly above or below the microprocessors. Wiring used to connect the memory chips to the microprocessors become considerably short, and hence the connection presents no problem of transmission delay, like the memory chips and the microprocessors arranged in a plane.

In the twenty-third means M23, the terminating resistor circuit chip is provided in the chip carrier multilayer structure. This chip terminates input/output signals of another chip, and hence no noise resulting from reflection arises unlike a multilayer structure which is not terminated.

In the twenty-fourth means M24, the chip carriers and the capacitor film are stacked, and they are connected between the ground and the power supply communicated to the chips. The capacitor film acts as a decoupling capacitor, and suppresses fluctuations of a power supply level caused by simultaneous switching noise of integrated circuits. As a result, the erroneous operation of the integrated circuit resulting from noise is prevented.

In the twenty-fifth means M25, the chip carriers and the thermally conducting substrate are stacked. Heat generated by the chips is diffused by the thermally conducting substrate, and hence it is possible to prevent an operation failure of the circuit resulting from a rise in temperature of a localized area of the laminate structure.

BRIEF DESCRIPTION OF THE DRAWINGS

FIGS. 2A to 2E are cross-sectional views illustrating one example of the connection processes of the first embodiment;

FIGS. 5A to 5C are cross-sectional views illustrating one example of the connection processes of the third embodiment;

DESCRIPTION OF THE PREFERRED EMBODIMENTS

Figure 1:
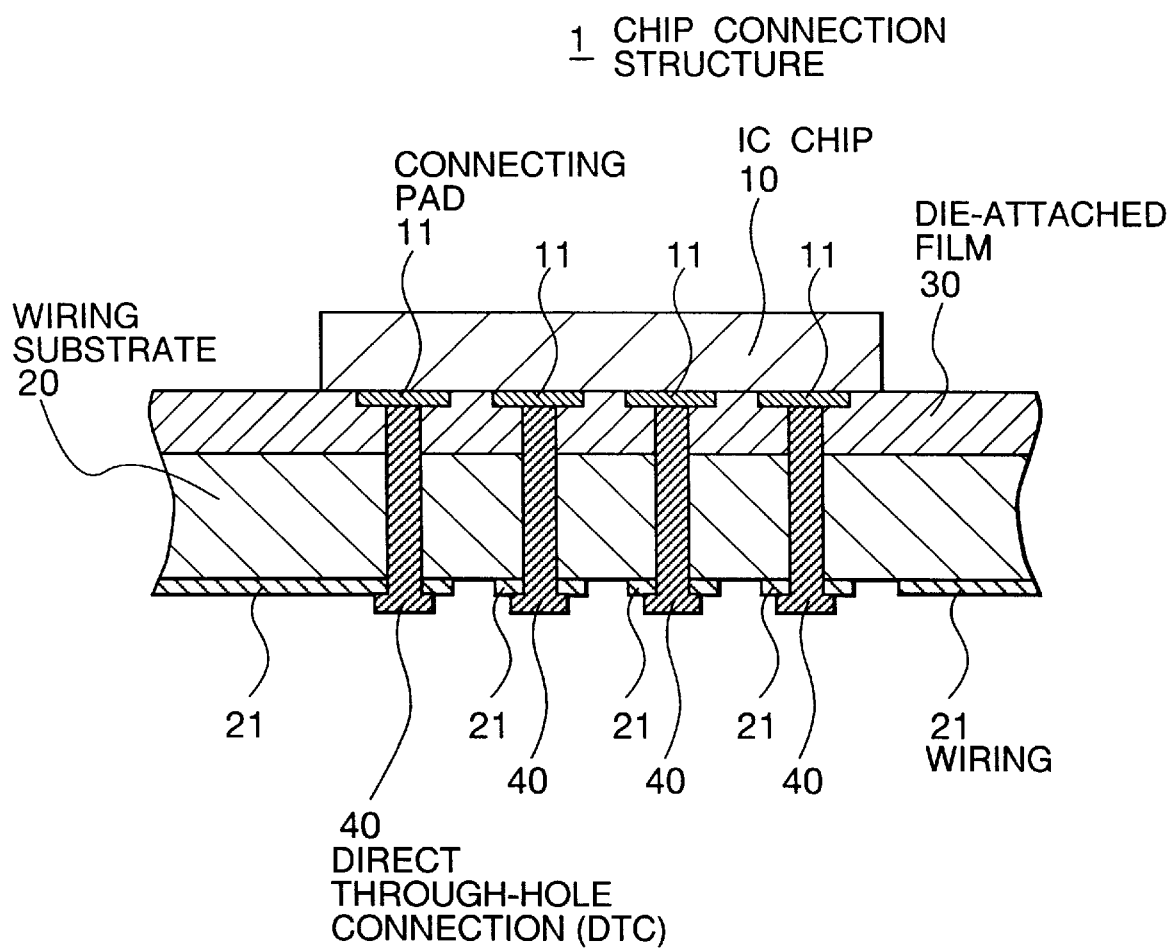
FIG. 1 is a cross-sectional view illustrating a basic chip connection structure according to a first embodiment of the present invention.

FIG. 1 is a cross-sectional view illustrating a basic chip connection structure according to a first embodiment of the present invention. In FIG. 1, the chip connection structure 1 is made up of an integrated circuit chip 10, a wiring substrate 20, and an adhesive film 30. The integrated circuit chip 10 is bonded to the wiring substrate 20 with a circuit surface of the integrated circuit chip facing the wiring substrate 20 by the adhesive film 30 by means of flip-chip die bonding (FCDB). Connecting pads 11 of the integrated circuit chip 10 are connected to wires 21 of the wiring substrate 20 through direct through-hole connections (DTC) 40 which are provided directly below the connecting pads 11 so as to pass through the wiring substrate 20 and the adhesive film 30. The integrated circuit chip 10 is formed by thinly processing the rear side of a silicon wafer on which integrated circuits and the pads 11 are formed, and by separating the integrated circuits into pieces (the integrated circuit chip has a thickness of, for example, 50 $\mu$m).

The wiring substrate 20 is made of one layer of a thin wiring film (having a thickness of, for example, 50 $\mu$cm). This wiring film is made of a polyimide film. Of polymer materials, this polyimide film has a particularly small dielectric coefficient. Material having a low thermal expansion coefficient close to silicon is selected for this polyimide film. The wires 21 provided on the lower surface of the substrate 20 is made of copper. Of common metallic materials, copper has the minimum resistivity. The wires 21 are formed by etching or plating.

The adhesive film 30 is made of a thin film (having a thickness of about 30 $\mu$m) which consists of a mixture of polyimide and bis-maleimid possessing high-temperature fluidity and a thermosetting property. The adhesive film 30 is previously bonded to the substrate 20 before FCDB is carried out. After having set, the adhesive film 30 is closely attached to the chip 10 and the substrate 20. This adhesive film 30 has smaller rigidity than that of the chip 10 and the substrate 20.

The direct through-hole connections 40 is formed by metallizing through-holes, which are formed so as to pass through the substrate 20 and the adhesive film 30, using copper plating. The diameter of the through-hole is set less than the diameter of the connecting pad 11 and more than half the thickness of the substrate 20.

FIGS. 2A through 2E are cross sectional views illustrating one example of the connection processes of the first embodiment.

The thickness of a wafer 50 is reduced in the process shown in FIG. 2A. The wafer 50 on which integrated circuits and the connecting pads 11 for input/output purposes are formed is polished from its rear side. A cut portion 51 is irrelevant from the circuit operation. A larger amount of abrasion is better to reduce the thickness of the wafer to a greater extent. However, the amount of abrasion is set allowing for a drop in reliability which results from distortion developed in the wafer 50 or the difficulty of handling.

FIG. 2B shows the dicing of the wafer 50. An adhesive film 52 having ductility is slightly attached to the wafer 50. The wafer 50 is cut into chips in a predetermined size (designated by a dotted line in the drawing) by a dicing saw. At this time, the adhesive film 52 is left uncut.

FIG. 2C shows the setting of the chips 10. Predetermined clearance 53 is created between the chips 10 by extending the adhesive film 52 in the direction designated by the arrow in the drawing.

Figure 2D:
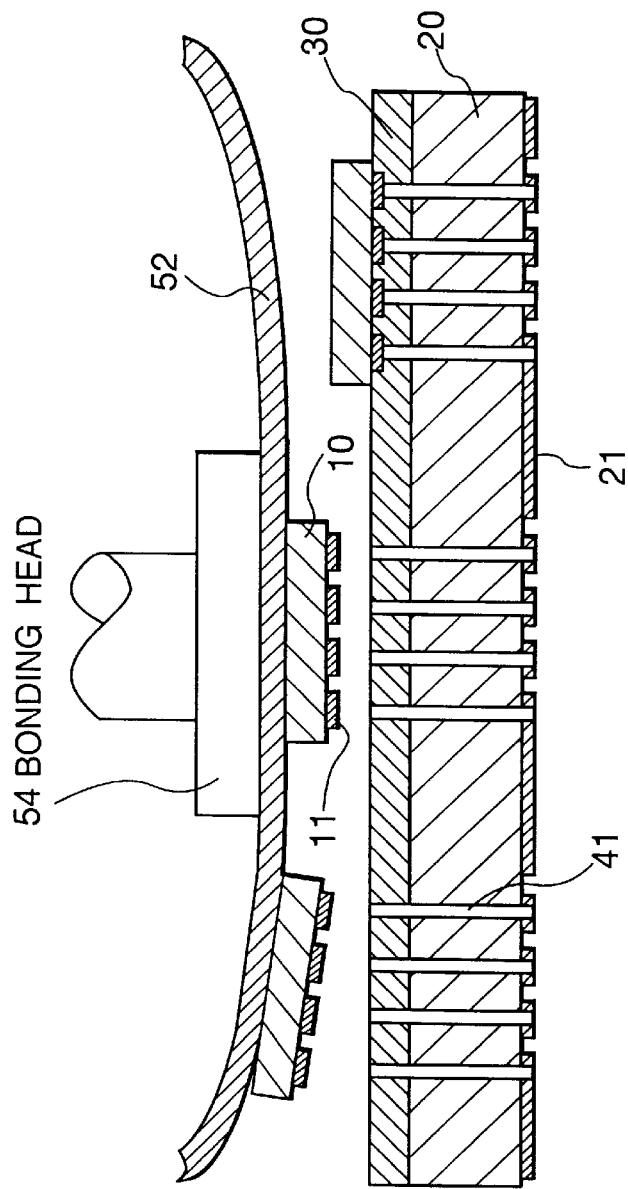

FIG. 2D shows the flip-chip die bonding of the chips 10. To begin with, the adhesive film 30 is previously attached to the substrate 20, and through-holes 41 (having a diameter of 50 μcm) are formed so as to pass through the substrate 20 and the adhesive film 30 by a drill or an excimer laser. The chips 10 attached to the adhesive film 52 are conveyed on the substrate 20, and the connecting pads 11 and the through-holes 41 are brought in alignment with each other. Finally, a bonding head 54 is lowered to bring the chip 10 into contact with the surface of the adhesive film 30, and the head 54 is heated and pressurized. Once softened up, the adhesive film 30 comes into close contact with the surfaces of the chip 10 and the substrate 20 (the material of the adhesive film 30 is designed in such a way that the through-holes 41 previously formed in the adhesive film 30 are not crushed even when the adhesive film becomes soft). Subsequently, the adhesive film 30 sets, so that the chip 10 and the substrate 20 are closely fixed to each other. The chip 10 is removed from the adhesive film 52. The remaining chips 10 are also mounted, one by one, to the substrate 20 in the same manner.

Figure 2E:
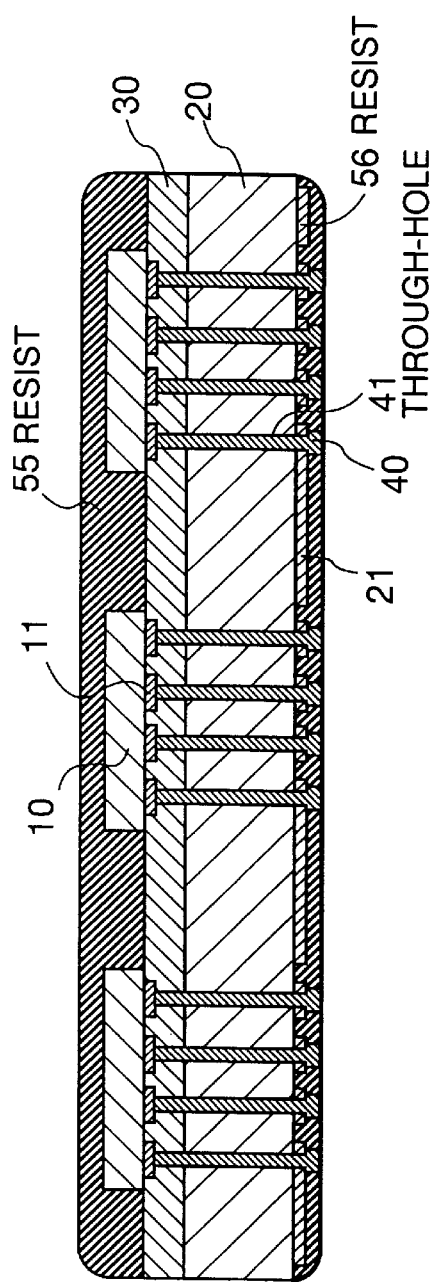

FIG. 2E shows the formation of the direct through-hole connections 40. Resists 55 and 56 are applied to the chips 10 mounted on the substrate 20 and the wires 21 except for the peripheries of the through-holes 41, respectively. The substrate 20 is soaked into a plating solution bath, so that the substrate is subjected to electroless copper plating. Copper actively grows from the preprocessed connecting pads 11, and thereafter the through-holes 41 are filled with the copper. As a result, the wires 21 are connected to each other. In this way, the direct through-hole connections 40 that connect the connecting pads 11 to the wires 21 are simultaneously formed on the plurality of chips 10 by one operation.

After the completion of the process shown in FIG. 2E, the resists 55 and 56 are removed, and the substrate 20 is cut into pieces by pressing or laser cutting. Thus, the chip connection structure 1 of the first embodiment shown in FIG. 1 is completed.

By virtue of the chip connection structure 1 of the first embodiment, the direct through-hole connection 40 is formed directly below the chip 10, and hence an additional bonding area required by WB or TAB becomes unnecessary. The packaging area of the chip 10 with respect to the substrate 20 is equal to the surface area of the substrate, and hence higher-density packaging of the chip connection structure becomes possible compared with the chip connection structure obtained by WB and TAB.

The direct through-hole connections 40 are formed in the thin substrate 20 and an adhesive film 30, and therefore it is not necessary to ensure the space for chip connection purposes (for example, a wire of WB and a bump of FCSB) on the outside of the substrate and the adhesive film. Further, the chip 10 itself is thinly processed so as to remove its portions irrelevant to circuit operation. It is possible to reduce the thickness of the chip connection structure to a much greater extent.

The direct through-hole connections 40 can be two-dimensionally formed over the surface of the chip 10. The substrate 20 and the adhesive film 30 are made thin, and therefore it is possible to easily form the direct through-hole connections 40 even if the diameter and pitch of the connections are miniaturized. For this reason, a considerably large number of connections can be made on the chip 10 compared with the number of connections made on the chip by WB and TAB. The packaging area is reduced to the minimum, and hence a connection density can be remarkably improved.

The direct through-hole connections 40 are directly connected to the connecting pads 11 and the wires 21. The length of the connection becomes considerably smaller than the connection obtained by WB and TAB, and therefore resistance and inductance are reduced. In addition, the direct through-hole connections 40 are made of a low-resistance material, and the substrate 20 is made of a low-resistance wire and a low-dielectric constant insulator. Therefore, the transmission delay of a signal is reduced, and the attenuation of the signal is also prevented. Hence, signal transmission faster than the conventional transmission becomes possible.

The overall chip 10 is adhered to the substrate 20 by FCDB, and hence stress acting between the chip 10 and the substrate 20 is scattered. Further, the chip 10 and the substrate 20 have a similar coefficient of thermal expansion, and therefore stress developed resulting from a difference between the thermal expansion coefficients is very small. The adhesive film 30 is softer than the chip 10 and the substrate 20 and, therefore, absorbs distortion of the chip 10 and the substrate 20. In this way, the stress acting on the chip 10 and the direct through-hole connections 40 is considerably prevented, as a result of which the reliability of the chip connection structure is improved.

Unlike a substrate and an adhesive film fed in HDI, the substrate 20 and the adhesive film 30 are not stacked on the chip, but they are fed in the form of a large sheet or a long tape for mass-production purposes. In FCDB, the connecting pads 11 are positionally aligned to the through-holes 41, and they can be easily connected to the through-holes 41 by simply heating and pressurizing the pads. The diameter of the through-hole 41 is smaller than the connecting pad 11, and hence a margin for positioning can be ensured. The direct through-hole connections 40 can be easily created by soaking the connections in a plating solution bath. FCDB can process a much larger amount of direct through-hole connections than the amount of bumps formed by TAB and FCDB by one operation. The aspect ratio of the through-hole 41 is less than twice, and hence the plating solution can smoothly enter the through-hole deep inside, and the through-hole is well plated. Hence, it is possible to assemble the chip connection structure at low cost.

The inspection of the chip connection structure 1 is carried out by probing a pad (not shown) formed at a part of the wire 21. The inspection is easy to carry out by virtue of the exposed wire 21. The reliability test of the chip connection structure 1 can be simply implemented by use of a socket suitable for the chip connection structure 1.

As previously mentioned, the chip connection structure of the first embodiment has three merits, that is, high-density packaging, high performance, and low cost which are realized by virtue of FCDB and the direct through-hole connections. These merits have never been achieved by the conventional technologies, that is, WB, TAB, FCSB, and HDI.

FCDB and the direct through-hole connections are important constituent elements in the first embodiment, there are a variety of variations on the other constituent elements and processes depending on applications.

The chip 10 can be made thin by chemical etching other than polishing employed in the first embodiment. An integrated circuit is formed in a silicon layer on an insulator layer (silicon dioxide) using a silicon-on-insulator wafer. The bulk (silicon) below the insulator layer is removed using a potassium hydroxide solution or a hydrazine solution. The insulator layer acts as an etch stopper, and hence the integrated circuit formed in the silicon layer is not eroded. A considerably thin chip consisting of only a silicon layer and an insulator layer is obtained without accurate thickness control. As a matter of course, it is not necessary to reduce the thickness of the package if the package is allowable in size.

Although the number of the chip 10 in the first embodiment is one, it is possible to form a multichip module by arranging a plurality of chips on a substrate or marrying chips having different functions. For example, chips, such as an amplifier, a driver, switches, memory, a digital signal processor, and microprocessors, are mounted on a substrate depending on applications of the computer, the IC card, or imaging equipment.

Depending on the requirements such as the number of wires, electrical performance, and mechanical strength, printed wiring boards made of glass epoxy or bis-maleimid or ceramic substrates made of alumina or mullite (which adds to the cost) can be used for the substrate 20. In addition to copper, it is possible to select material from gold, silver, aluminum, tungsten, and molybdenum for the wire in consideration of resistivity or a joint strength between the wire and the substrate 20. In addition to plating and etching, the wire is formed by screen printing using an electrically conductive paste or vapor deposition. Although a substrate on which wires are patterned prior to FCDB is used in the connection process of the first embodiment, it may be possible to pattern wires on a metal coated substrate after direct through-hole connections have been formed in the substrate, or to pattern wires on a metal-less substrate after direct through-hole connections have been formed, in consideration of consistency in a series of processes before and after the wiring and costs for the formation of the wire.

In the case of the substrate 20 in the first embodiment, the wires 21 are formed on one side of one layer film. If a further increase in speed is required, the wires 21 will be made in the form of a coplanar line. If the wire is formed in the coplanar line, a feed line for power supply or grounding is provided on both sides of the signal line. As a result, the characteristic impedance is matched, and crosstalk between the signal lines can be prevented. If an increase in the number of wires as well as in speed is desired, wires will be formed on both sides of the substrate to constitute a microstrip line. In other words, the reference plane (a power supply or the ground) is provided on the upper or lower surface of the signal line. When a larger number of wires are necessary a multilayer wiring board is usable if a cost rise should be expected.

In addition to the polyimide-based films, epoxy-based films (which are inexpensive but have higher dielectric constant) may be usable for the adhesive film 30 used in FCDB. Photosensitive resins, for example, ultraviolet setting type resin may be usable as required. The material used in the first embodiment is designed allowing for the fusing and thermosetting properties. However, the material is selected, which allows for adhesive property, heat resistance, flexibility, geometrical accuracy, insulation resistance, dielectric constant, coefficient of thermal expansion, and cost depending on the purpose of the use of the material. In addition to the lamination of the adhesive film to the substrate as illustrated in the first embodiment, the adhesive film is applied or printed on the substrate.

The direct through-hole connection 40 can be made of gold, silver, aluminum, or solder in addition to copper. It can be made by sputtering, vapor deposition, or printing in addition to plating. The method of the formation of the direct through-hole connection 40 is dependent on cost. In addition to the electroless plating, the plating method includes electrolytic plating so long as it permits the removal of electrodes. Although the through-holes 41 are formed in the substrate and the adhesive film prior to FCDB in the first embodiment, they may be formed by etching or laser processing after FCDB depending on the material used for the substrate and the adhesive film, and thereafter the through-holes are metallized.

In this way, the chip connection structure of the first embodiment has a variety of modifications and can be employed in widespread applications.

Figure 3:
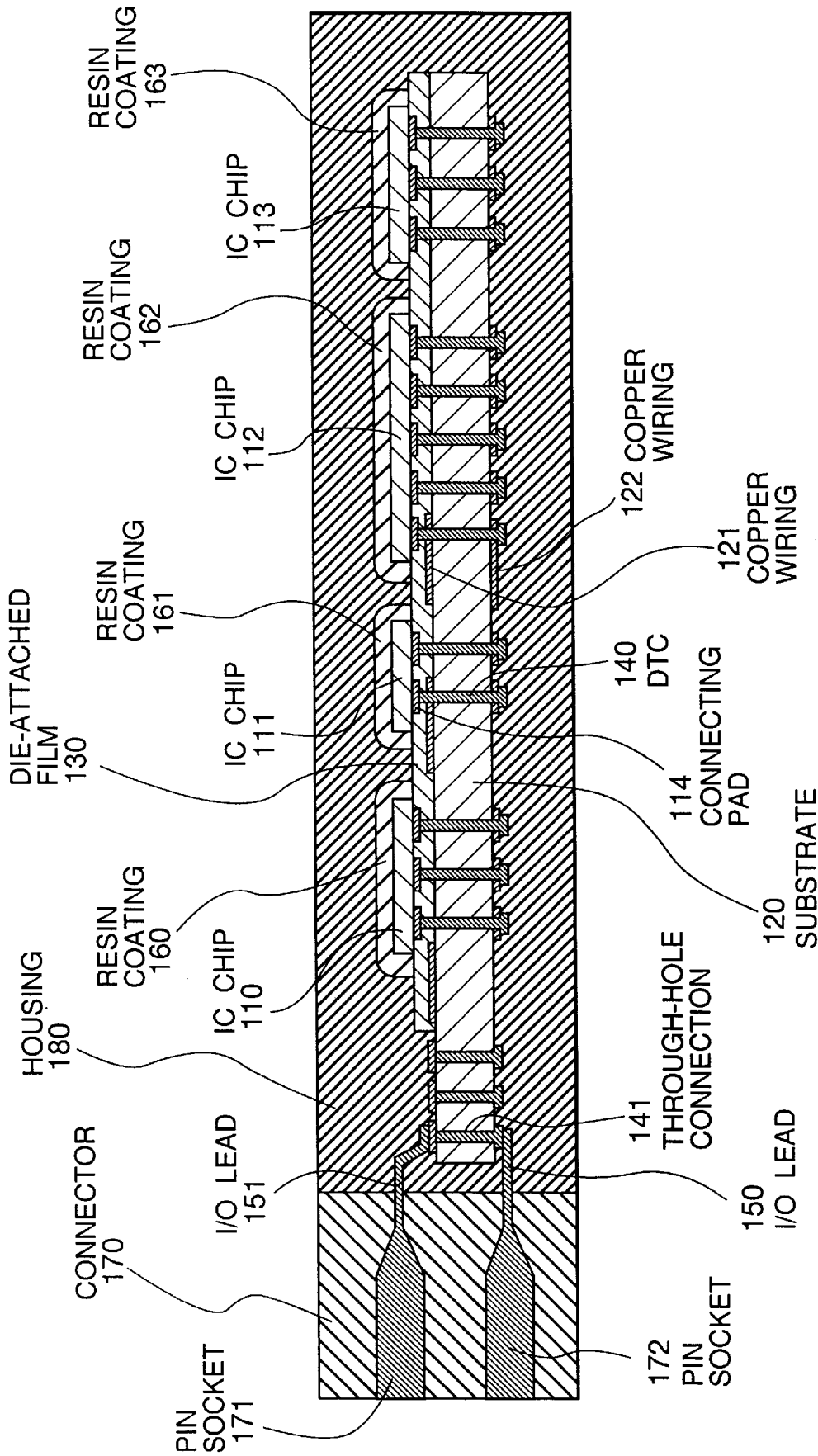
FIG. 3 is a cross-sectional view illustrating a chip connection structure according to a second embodiment of the present invention.

FIG. 3 is a cross-sectional view illustrating a chip connection structure according to a second embodiment of the present invention. In FIG. 3, a chip connection structure 100 is a hybrid integrated multichip module consisting of integrated circuits 110, 111, 112, and 113. This module comprises the chips 110, 111, 112, 113, a wiring substrate 120, and an adhesive film 130. A connector 170 is connected to this module, and the module is contained in a housing 180.

The chips 110, 111, 112, and 113 are mounted to the substrate 120 by means of FCDB using the adhesive film 130. Connecting pads 114 of the chips are connected to wires 121 and 122 of the substrate 120 through direct through-hole connections 140 which are formed so as to pass through the substrate 120 and the adhesive film 130. A part of the wires 121 and 122 is connected to pin sockets 171 and 172 of the connector 170 via the through-hole connections 141 and input/output leads 150 and 151.

The chips 110, 111, 112, and 113 are made up of processors and memory. Each of the chips is thinly processed from its rear surface side and has an even thickness. The substrate 120 is made of a thin glass epoxy film, and the copper wires 121 and 122 are formed on both sides of the film. The adhesive film 130 is made of an epoxy-based adhesive. The direct through-hole connections 140 and the through-hole connections 141 are formed at the same time by copper plating.

The rear surfaces of the chips 110, 111, 112, and 113 and the adhesive film 130 surrounding the chips are respectively covered with coatings 160, 161, 162, and 163 made of resin. The coatings are formed by molding or potting, and the chips 110, 111, 112, and 113 are sealed by these coatings.

According to the chip connection structure 100 of the second embodiment, the chips 110, 111, 112, and 113 are sealed by the coatings 160, 161, 162, and 163. These chips receive inputs and send outputs through the input/output leads 150 and 151. Hence, it is not necessary to individually package the chips one by one, and the multichip module is simply constituted.

The chips 110, 111, 112, 113, the substrate 120, and the adhesive film 130 are made of a thin film, and hence the chip connection structure 100 of the second embodiment is suitable for card or sheet-shaped personal equipment which particularly needs a low profile.

If the reliability of the areas in the vicinity of the direct through-holes 140 must be improved further, the opposite side of the substrate 120 to the chips 110, 111, 112, and 113 are covered with a coating. Alternatively, the substrate 120 and the chips 110, 111, 112, and 113, as a whole, are covered with a coating.

Although the leadframe is used for the input/output leads 150 and 151 in the second embodiment, the leads may be replaced with a pin or a solder ball. In some cases, a lead wire portion may be provided in the substrate 120 itself like a daughter card connected to a mother board.

Figure 4:
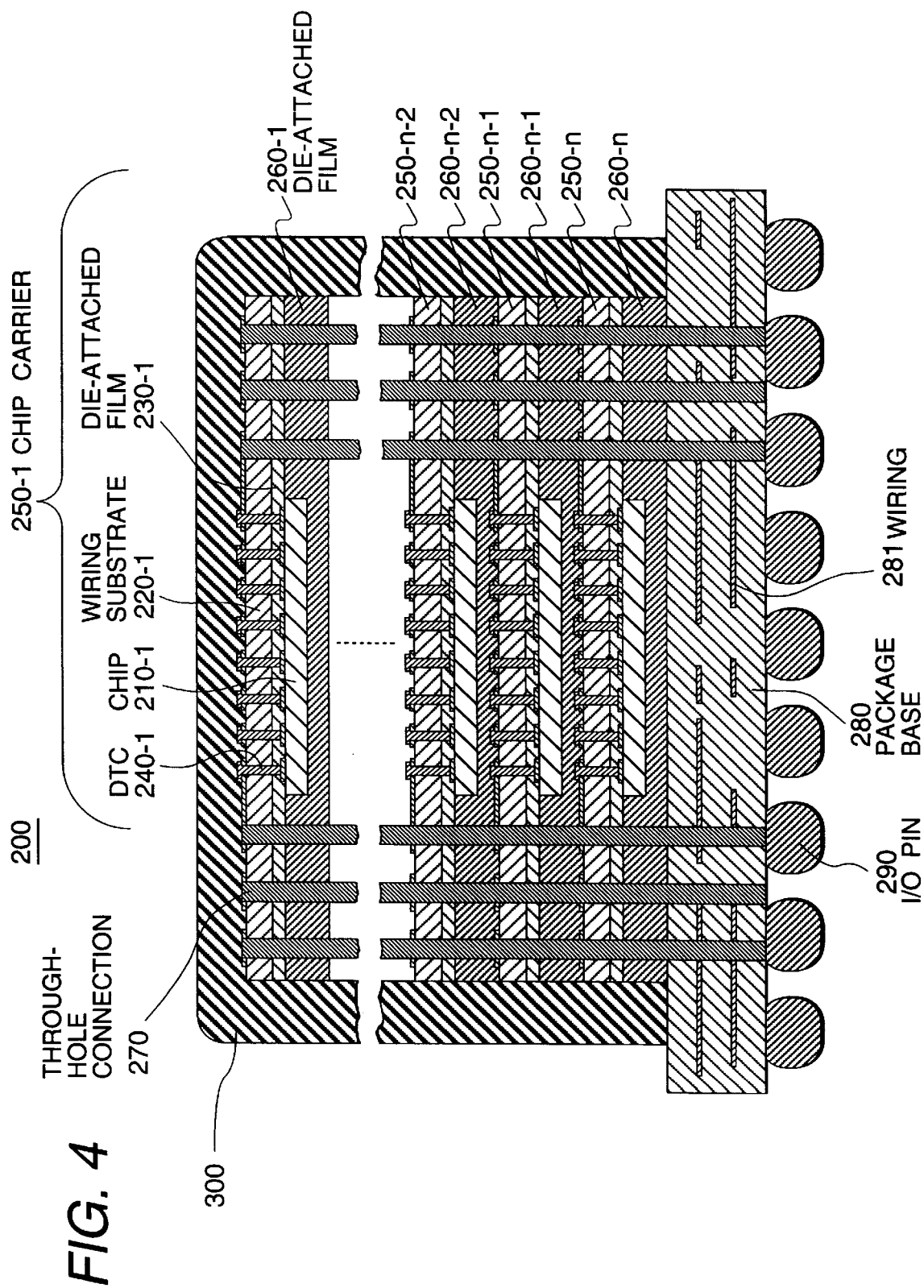
FIG. 4 is a cross-sectional view illustrating a chip connection structure according to a third embodiment of the present invention.

FIG. 4 is a cross-sectional view illustrating a chip connection structure according to a third embodiment of the present invention. A chip connection structure 200 is a multichip module formed resulting from integration of multilayered chips 210-1 to 210-n (n is the number of layers, and this shall apply to the following descriptions). The multichip module is principally made up of chip carriers 250-1 to 250-n, adhesive films 260-1 to 260-n, a package base 280, input/output pins 290, and a coating 300.

The chip carriers 250-1 to 250-n are fixed to each other by means of the adhesive films 260-1 to 260-n, and the stacked chip carriers are mounted to the package base 280 by the adhesive film 260-n. Interlayer connections between the chip carriers 250-1 to 250-n, and a connection between the stacked chip carriers to the package base 280 are established through through-hole connections 270 which are formed so as to pass through the chip carriers 250-1 to 250-n and the package base 280. The through-hole connections 270 are connected to the input/output pins 290 via wires 281 of the package base 280.

The chip carrier 250-1 is made up of chips 210-1, a wiring substrate 220-1, and an adhesive film 230-1 (this construction applies to all of the other layers from 250-2 to 250-n). The chips 210-1 are bonded to the substrate 220-1 by FCDB using the adhesive film 230-1. Connecting pads (omitted from the drawing) of the chip 210-1 are connected to wires (omitted from the drawing) of the substrate 220-1 through the direct through-hole connections 240-1 which are formed so as to pass through the substrate 220-1 and the adhesive film 230-1. The wires are connected to the input/output pins 290 via the through-hole connections 270 and the wires 281.

To reduce the thickness of the chip connection structure 200, the chips 210-1 to 210-n are processed by polishing or etching. A thin film member is used for the substrates 220-1 to 220-n and the adhesive films 230-1 to 230-n and 260-1 to 260-n. This thin film member is made of polyimide-based materials having a low dielectric constant. The package base 280 is a low-profile multilayer substrate which consists of a bis-maleimid-based resin. The wires of the substrate 220-1, the wires 281 of the package base 280, the direct through-hole connections 240-1 to 240-n, and the through-hole connections 270 are made of copper possessing low resistance. To draw a large number of pins, the input/output pins 290 connected to the wires 281 are formed from a solder ball grid array. Resin for mold sealing is used for the coating 300 that covers the chip carriers 250-1 to 250-n and a part of the package base 280.

FIGS. 5A through 5E are cross-sectional views illustrating one example of the multilayer connection processes according to the third embodiment.

Prior to the process shown in FIG. 5A, the chips 210-1 to 210-n are bonded to the respective chip carriers 250-1 to 250-n by FCDB, and the direct through-hole connections 240-1 to 240-n are formed by a process similar to the process shown in the first embodiment. The chip carriers 250-1 to 250-n are previously subjected to a reliability test by fitting the carriers to the socket, as required.

In the process shown in FIG. 5A, the chip carriers 250-1 to 250-n are stacked on top of each other in layers on the package base 280. To begin with, adhesive films 260-1 to 260-n are respectively sandwiched between the chip carriers 250-1 to 250-n, and an adhesive film 260-n is sandwiched between the chip carrier 250-n and the package base 280. The chip carriers 250-1 to 250-n are stacked, on top of each other, on the package base 280. The thus stacked assembly is heated and pressurized, as a result of which the adhesive films 260-1 to 260-n come into close contact with the chip carriers 250-1 to 250-n and the package base 280 and then set into a single package.

Figure 5B:
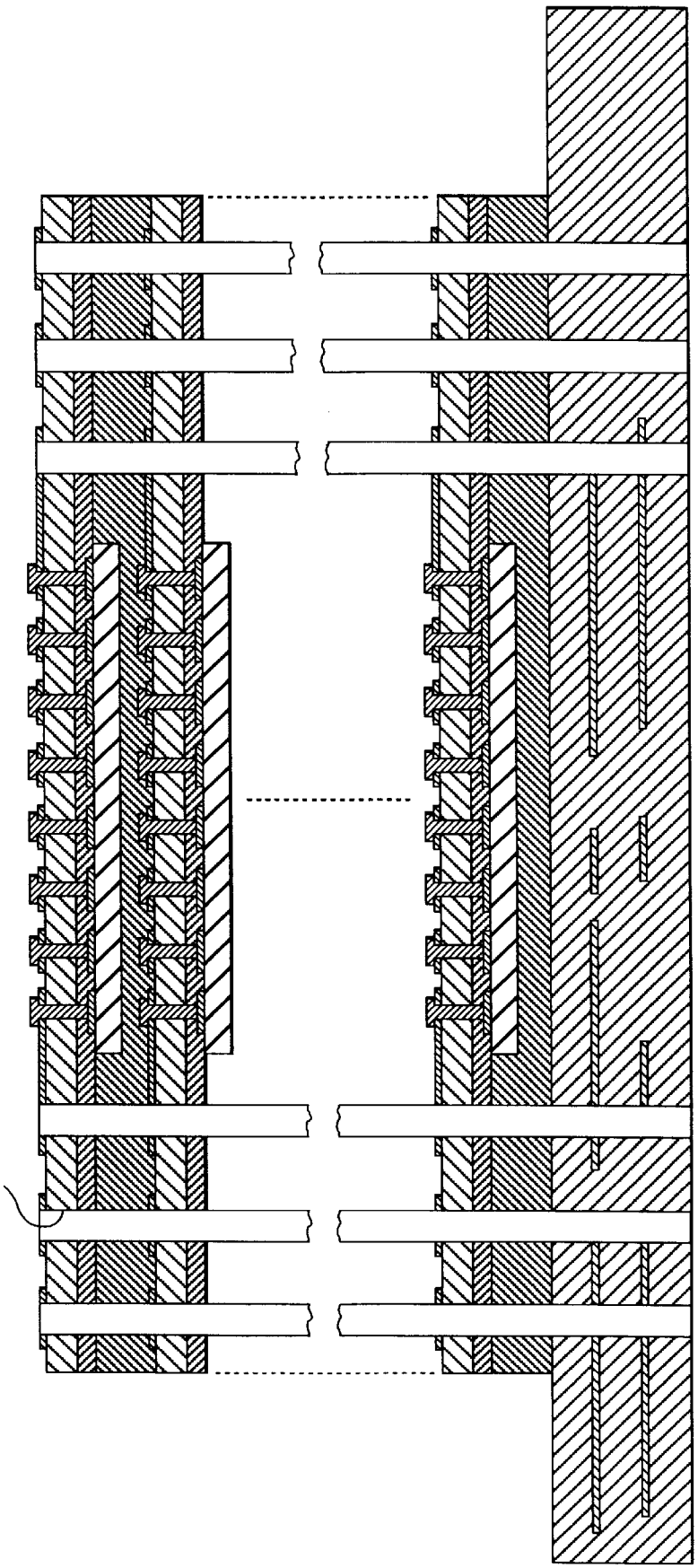

In the process shown in FIG. 5B, the through-holes 271 are formed. The through-holes 271 are formed by a drill or a laser at predetermined positions in the wires of the substrates 220-1 to 220-n and the wires 281 in such a way as to pass through the stacked chip carriers 250-1 to 250-n bonded to the package base 280 (a laminate).

Figure 5C:
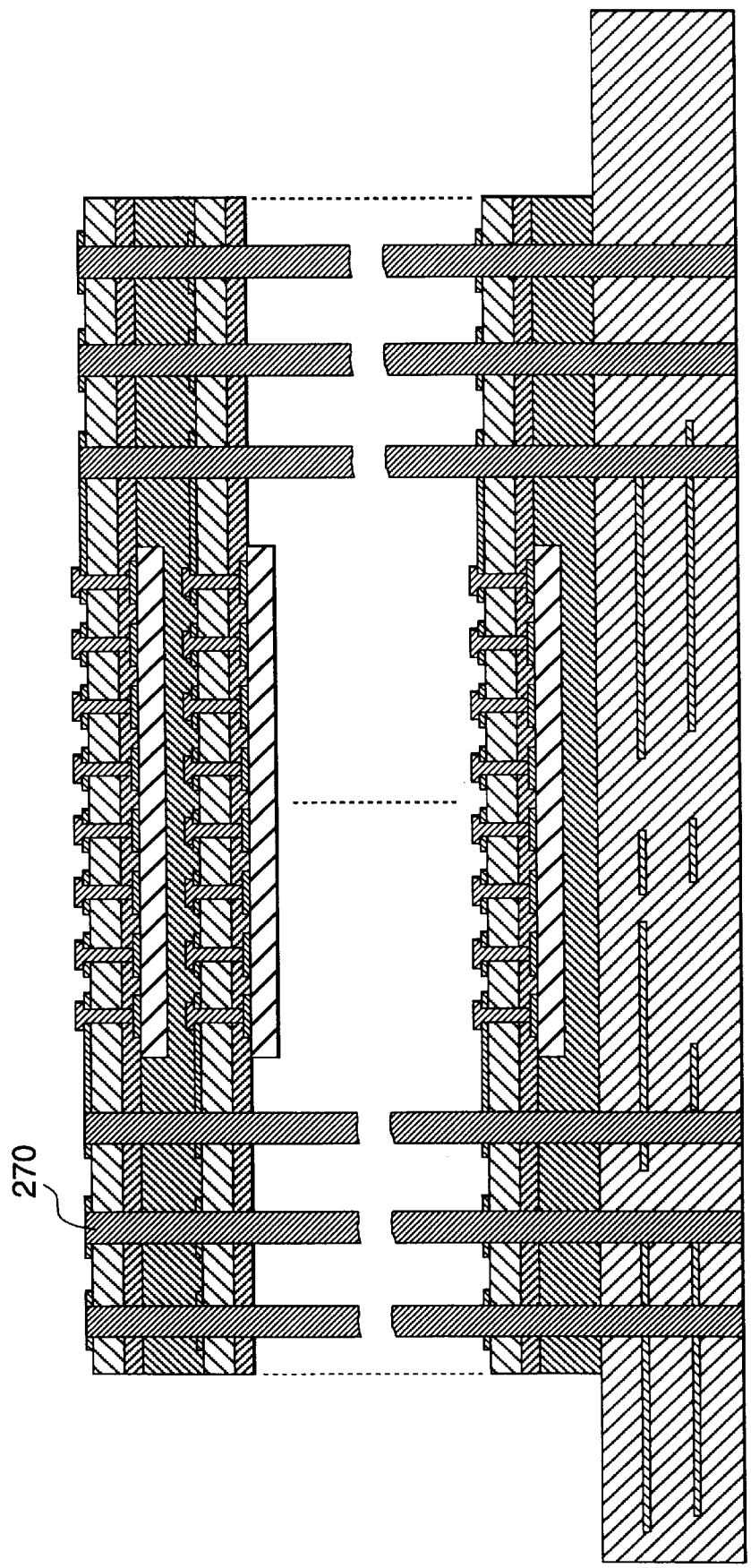

In the process shown in FIG. 5C, the through-hole connections 270 are formed. The laminate is soaked into a copper plating solution bath, and the through-hole connections 271 are plated with copper. A resist is previously applied to the areas which need not to be plated. In this way, the through-hole connections 270 that connect the chip carriers 250-1 to 250-n with the package base 280 are formed by one operation. In the previously mentioned third embodiment, since the height of the laminate is reduced, the aspect ratio of the through-hole connection does not become larger even if the diameter of the through-hole connection 270 is made smaller. For this reason, the through-hole connections 270 are easily plated.

The laminate is placed in a mold after the process shown in FIG. 5C, and it is then molded by the coating 300. Finally, solder balls that form the input/output pins 290 are fed by use of an arrangement jig, and the solder balls are connected to the package base 280. As a result, the package of the chip connection structure 200 of the third embodiment shown in FIG. 4 is completed. Thereafter, the chip connection structure 200 is fitted to the ball grid array socket and, then, subjected to inspection such as a burn-in test.

According to the previously mentioned chip connection structure 200 of the third embodiment, the chips 210-1 to 210-n are three-dimensionally stacked by the adhesive films 260-1 to 260-n, and they can be connected together through the direct through-hole connections 240-1 to 240-n and the through hole connections 270. The direct through-hole connections 240-1 to 240-n are formed directly below the chips 210-1 to 210-n, and hence it is not necessary to ensure the space for the through-hole connections. Further, the through-hole connection 270 has a small diameter, and hence the area surrounding the chips 210-1 to 210-n is reduced to the minimum. Furthermore, the substrates 220-1 to 220-n, the adhesive films 230-1 to 230-n, 260-1 to 260-n, and the package base 280 as well as the chips 210-1 to 210-n are reduced in thickness. For this reason, an area and a thickness, that is, a chip packaging density per volume, is considerably improved.

The direct through-hole connections 240-1 to 240-n that have a small diameter and are formed on small pitches can connect the connecting pads of the chip 210-1 to 210-n to the wires of the substrates 220-1 to 220-n, because the thicknesses of the substrates 220-1 to 220-n and the adhesive films 230-1 to 230-n are small. Further, since the thicknesses of the chip carriers 250-1 to 250-n, the adhesive films 260-1 to 260-n, and the package base 280 are small, the diameter and pitch of the through-hole connection 270 can be reduced. Furthermore, it is possible to draw the input/output pins 290 out of the bottom surface of the package base 280 through the ball grid array which is two-dimensionally arranged in a high density manner. Hence, it is possible to increase the number of chips and the number of inputs and outputs for the package as a result of the third embodiment.

The length of the direct through-hole connections 240-1 to 240-n is considerably small. As a result of high-density connection of the through-hole connections 270, it is possible to reduce the length of the wires of the substrates 220-1 to 220-n from the direct through-hole connections 240-1 to 240-n to the through-hole connections 270. Further, the substrates 220-1 to 220-n, the adhesive films 230-1 to 230-n, 260-1 to 260-n, and the package base 280 are made of material possessing a low dielectric constant. Further, the wires of the substrates 220-1 to 220-n, the wires 281, the direct through-hole connections 240-1 to 240-n, and the through-hole connections 270 are made of a material possessing small resistance. Hence, it is possible to reduce the resistance, inductance, and capacitance associated with the wires and the connections, and therefore a signal can be transmitted at high speed by the third embodiment.

The adhesive films 230-1 to 230-n and 260-1 to 260-n are made of a relatively soft material, and hence distortion developing between the chips 210-1 to 210-n and the substrates 220-1 to 220-n, between the chip carriers 250-1 to 250-n, and between the chip carriers 250-n and the package base 280 is absorbed by the respective adhesive films. For this reason, no stress concentrates on the direct through-hole connections 240-1 to 240-n and the through-hole connections 270, which in turn results in improved reliability of the chip connection structure 200.

The chip connection structure 200 is made of materials which are commercially available in the market. The chip carriers 250-1 to 250-n are connected by one operation in the same manner as they are connected in the first embodiment. During the connection of the chip carriers 250-1 to 250-n, the chip carriers are simultaneously stacked on top of each other in layers by means of the adhesive films 260-1 to 260-n. The through-hole connections 270 are easily formed by one operation as a result of plating. For this reason, a large quantity of the chip connection structure 200 is easily assembled without the need of expensive materials and facilities, which renders the package very inexpensive.

As previously mentioned, according to the third embodiment, by virtue of FCDB used for forming a chip carrier, the direct through-hole connections, the stacking of the chip carriers, and the through-hole connections, it is possible to provide a chip connection structure that implements multipin high-density packaging, high-speed signal transmission, high reliability, and low cost which have never been attained by the conventional technologies, that is, WB, TAB, FCSB, and HDI. This is attributable to a problem of a large surrounding area of the chip encountered in WB and TAB, a problem of a large thickness of one layer encountered in WB and FCSB, and a problem of a high cost for manufacturing one layer encountered in TAB, FCSB, and particularly HDI.

The chip connection structure of the third embodiment is used for chips having various functions, and the construction of the chip connection structure can be modified depending on its application.

In the third embodiment, the chips 210-1 to 210-n are mounted on the chip carriers 250-1 to 250-n one for each carrier. In another modified embodiment, it is possible to realize a multichip module structure in which a plurality of chips of the same type or different types are disposed on the chip carrier or each layer has a different function.

In this embodiment, the adhesive films 260-1 to 260-n are fed in the form of a solid substance for convenience of handling. However, if sufficient facilities are available, it is possible to stack the chip carriers 250-1 to 250-n on top of each other in layers by applying or injecting a liquid adhesive in the form of a film. The set adhesive has the same function as the adhesive film, and therefore a chip connection structure similar to the chip connection structure of the third embodiment is implemented.

The adhesive films 260-1 to 260-n are made of blended polymers which are based on polyimide. However, it is possible to add other functions to the adhesive film other than adhesiveness. For example, as a result of a mixture of the adhesive and a filler made of insulating material having high thermal conductivity and low thermal expansion coefficient, the radiation of heat of the chips 210-1 to 210-n is promoted, and thermal stress exerted between the chips 210-1 to 210-n and the substrates 220-1 to 220-n can be reduced. The material of the adhesive film is designed, allowing for heat resistance and sealing in addition to the heat insulation.

The through-hole connections 270 are formed by plating in the same manner as it is commonly practiced in the processes of manufacturing a printed wiring board. Alternatively, the through-hole connections can be subjected to printing, potting, and metallization if requirements such as shape, electrical performance, and cost are satisfied.

In the third embodiment, the through-hole connections 270 pass through both the chip carriers 250-1 to 250-n and the package base 280 and are connected at one ends thereof to the package base 280. In some cases, the chip carriers are connected together through through-hole connections, and the laminate is connected to the package base by use of the conventional technology such as WB, TAB, or FCSB. If the conventional technology is not used for each layer of the laminate but for the overall laminate once, it is possible to prevent a sharp drop in packaging density and performance and an excessive burden of cost.

Although the chip carriers 250-1 to 250-n are connected to the input/output pins 290 via the package base 280 in the third embodiment, it is also possible to directly draw the input/output pins without the use of the package base. For example, leadframes are provided around the stacked chip carriers 250-1 to 250-n, and the wires of the substrate 250-1 in the vicinity of the through-holes 270 are directly connected to the leads by WB. The chip carriers and a part of the leads are covered with a coating using mold resin, whereby the laminate is packaged. In another example, while attention is given to the arrangement and sealing of the direct-through holes and the through-hole connections, it is also possible to directly draw a solder ball grid array or a pin grid array from the surface of the substrate 250-1 of the stacked chip carriers 250-1 to 250-n.

Although the coating 300 for sealing purposes is formed by molding, it can be formed by application or potting depending on conditions of the use of the module. A ceramic package which is more expensive than the coating 300 may be occasionally used in lieu of the coating 300 for sealing the stacked chip carriers 250-1 to 250-n. Further, in some cases, the sealing of the laminate using the adhesive films 260-1 to 260-n without the use of the coating 300 may be sufficient.

As mentioned above, the laminate multichip module consisting of the chip connection structure of the third embodiment can bring great effects by addition of variations to the basic structure depending on the conditions of the application of the module.

For instance, as one example of the applications of the laminate multichip module, it is possible to constitute a compact memory module having large capacity for use in the main memory of the computer. Dynamic random access memory is used for the chips 250-1 to 250-55 n in the third embodiment. In this case, the number of layers is four or eight, and one or two layers are often added to these layers.

The through-hole connections 270 that connect the chip carriers 250-1 to 250-n together are used for data input/output, address input, and feeding. Most of the through-hole connections 270 are commonly connected to the wires of the substrates 220-1 to 220-n, but some of them (at least a number of connections "$\log_2 n$") are separately connected so as to select the chips 250-1 to 250-n. Corresponding to this separate connection, a part of the wiring patterns of each of the substrates 220-1 to 220-n is modified by cutting when the wires are formed or after the wires have been formed. In this way, it becomes possible to make independent access to each of the chips 250-1 to 250-n.

To reduce the reflection of an input signal to the chips 250-1 to 250-n, terminating resistor chips are added to the chips 250-1 to 250-n, and the chips are stacked on top of each other in layers in the same manner as the chip carriers 250-1 to 250-n are stacked. As a result, a memory module of ease of use is formed.

Figure 6:
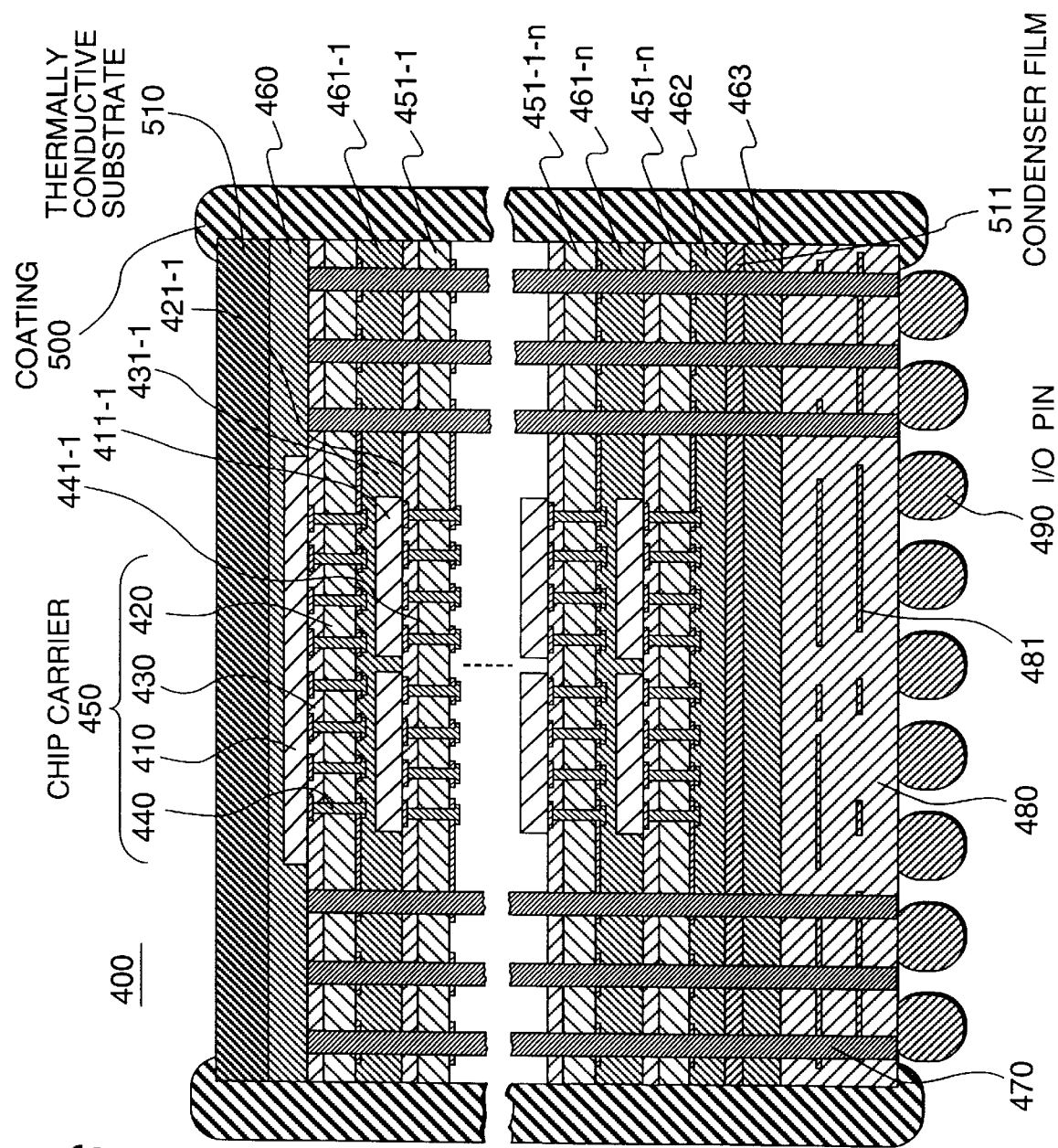
FIG. 6 is a cross-sectional view illustrating a chip connection structure according to a fourth embodiment of the present invention.
Figure 7A:
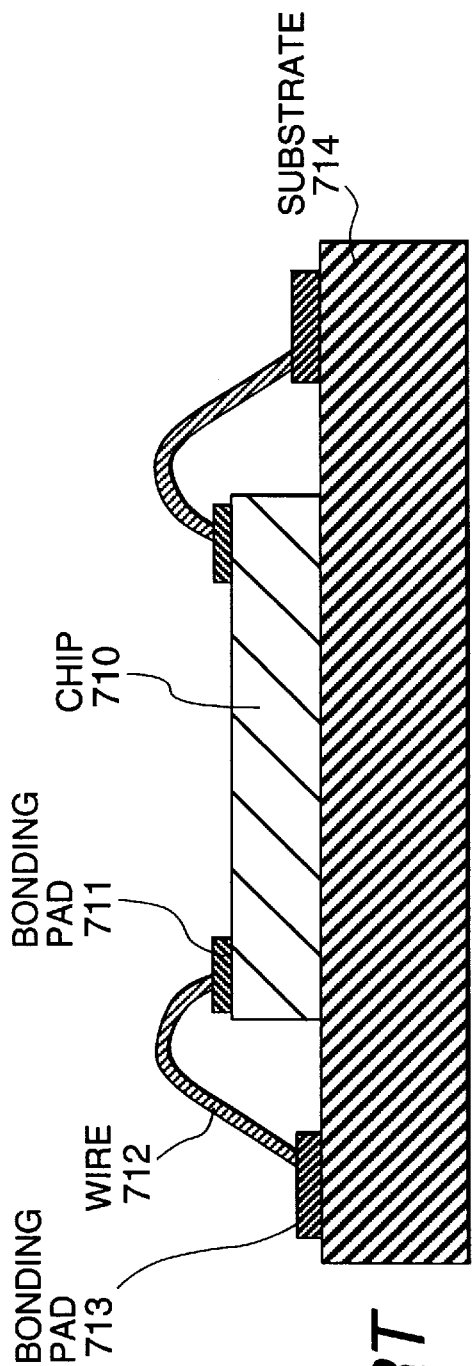
FIGS. 7A to 7D are cross-sectional views of a representative example of a chip connection structure in the prior art.
Figure 7B:
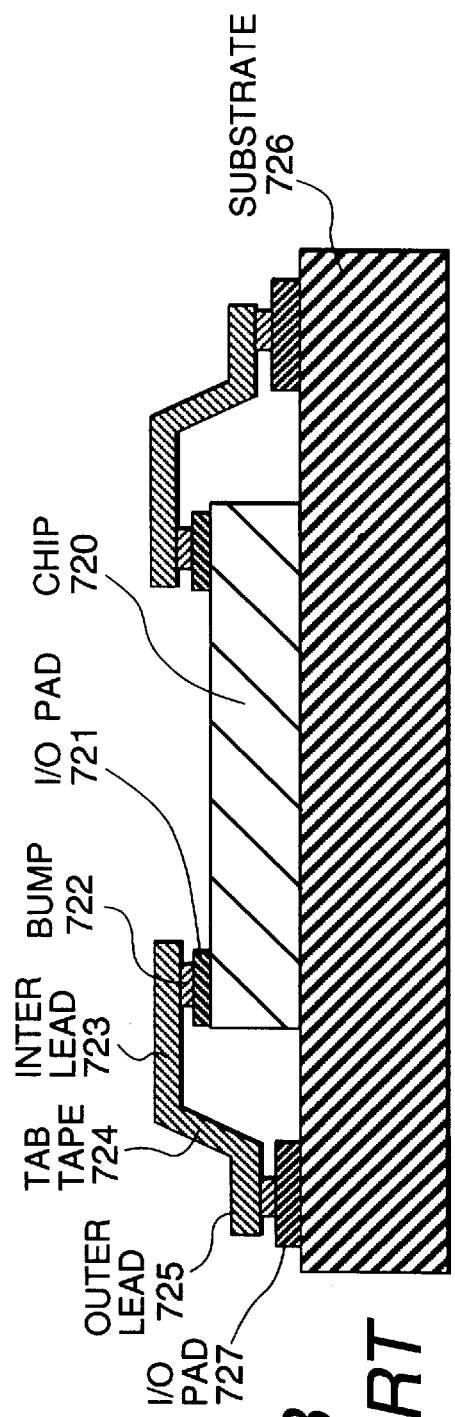
Figure 7C:
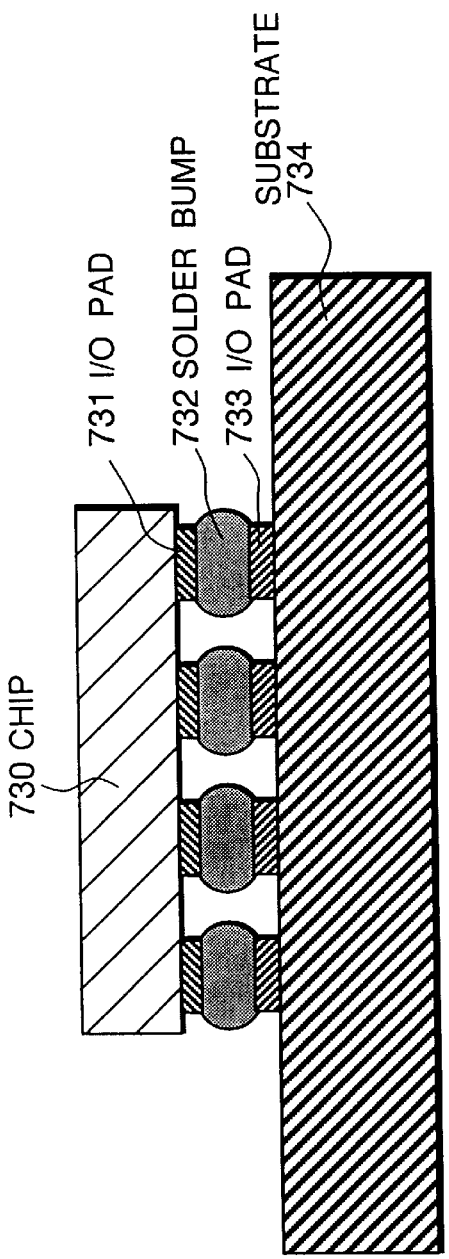
Figure 7D:
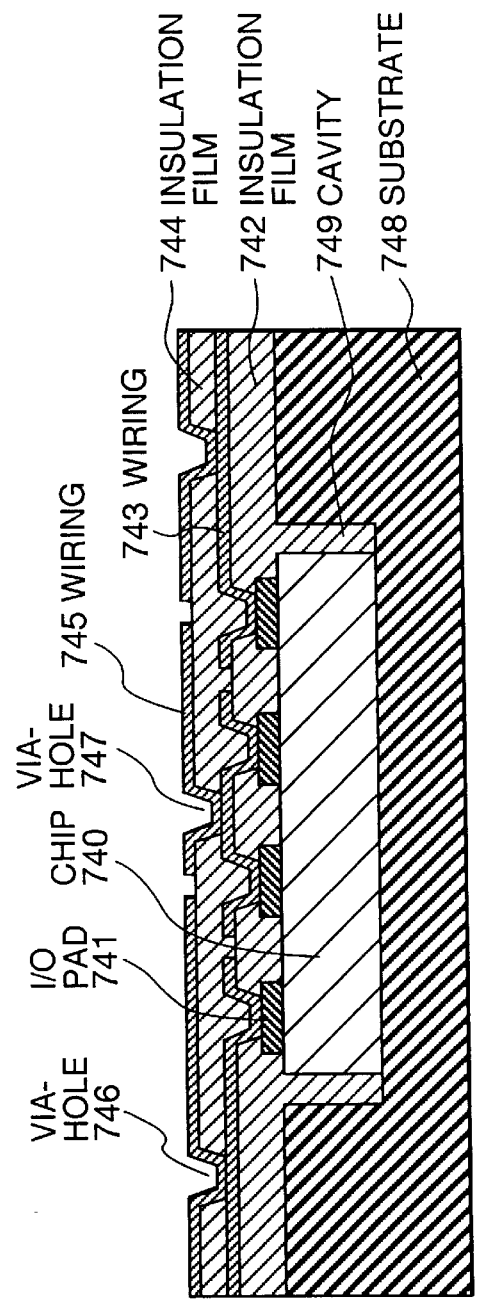

A processor module of the computer will be described as another example of the applications with reference to FIG. 6. FIG. 6 is a cross-sectional view illustrating a chip connection structure according to a fourth embodiment of the present invention. A chip connection structure 400 is a multichip module made up of the integration of stacked chips 410 and 411-1 to 411-n (n is the number of layers, and the same applies to the following descriptions). The multichip module comprises chip carriers 450, 451-1 to 451-n, a heat conducting plate 510, a capacitor film 511, adhesive films 460, 461-1 to 461-n, 462, 463, the package base 480, the input/output pins 490, and a coating 500.

The chip carriers 450, 451-1 to 451-n, the heat conducting plate 510, the capacitor film 511, and the package base 480 are connected to each other by the adhesive films 460, 461-1 to 461-n, 462, and 463. The chip carriers 450, 451-1 - 451-n, the capacitor film 511, and the package base 480 are connected to each other through the through-hole connections 470. The through-hole connections 470 are connected to the input/output pins 490 via the wires 481 of the package base 480.

The chip carriers 450 and 451-1–451-n are respectively made up of the chip 410 (one), the chips 411-1 to 411-n (four chips on each layer), the substrate 420 the substrates 421-1 to 421-n, and the adhesive films 430 and 431-1 to 431-n. The chips 410 and 411-1 to 411-n are bonded to the substrate by FCDB using the adhesive films 430 and 431-1 to 431-n. The connecting pads (not shown) of the chips 410 and 411-1 to 411-n are connected to the direct through-hole connections 440 and 441-1 to 441-n that are formed so as to pass through the substrates 420 and 411-1 to 411-n and the adhesive films 430 and 431-1 to 431-n. The number of layers of wires of the substrate 420 is larger than the number of layers of wires of the substrates 421-1 to 421-n. These wires are connected to other chip carriers 450 and 451-1 to 451-n and the package base 480 via the through-hole connection 470.

The heat conducting substrate 510 is substantially the same in coefficient of thermal expansion as the chip 410, and it is made of ceramics possessing high thermal conductivity (for example, aluminum nitride). The heat conducting substrate 510 and the chip 410 are fixed to each other by the adhesive film 460 possessing increased thermal conductivity.

The capacitor film 511 is made of material possessing a high dielectric constant (for example, tantalum oxide). Both surfaces of the capacitor film 511 are metallized, and they are respectively connected to the power supply and the ground of the input/output pins 490 via the wires 481 and the through-hole connections 470.

The package base 480 is made of a multilayer printed wiring board, and the input/output pins 490 consisting of a solder ball grid array are disposed on the bottom of the package base. The side surfaces of the package base 480, the chip carriers 450 and 451-1 to 451-n, the heat conducting substrate 510, and the capacitor film 511 are hermetically surrounded by the coating 500.

The stacked connection and the packaging of the chip connection structure 400 are easily effected in the manner as will be described later (the principal elements of this chip connection structure are substantially the same as those of the third embodiment, and hence it goes without saying that the cost of the structure is reduced). To begin with, each of the chip carriers 450 and 451-1 to 451-n is assembled. The adhesive films 460, 461-1 to 461-n, 462, and 463 are respectively sandwiched between the chip carriers 450 and 451-1 to 451-n, the capacitor film 511, and the package base 480. They are stacked on top of each other in layers and bonded together. After the through-hole connections 470 have been formed in the thus bonded laminate, the heat conducting substrate 510 is attached to the laminate by the adhesive film 460. Finally, the laminate is surrounded by the coating 500 by molding, and the input/output pins 490 are drawn.

If the chip 410 is formed from a microprocessor and the chips 411-1 to 411-n are formed from static random access memory, it is possible to constitute a high-performance processor module by virtue of the fourth embodiment. The static random access memory is used as a level-2 cache.

The microprocessor makes access to the level-2 cache by way of the direct through-hole connections 440, the substrate 420, the through-hole connections 470, the substrates 421-1 to 421-n, and the direct through-hole connections 441-1 to 441-n. Since the microprocessor is positioned in proximity to the level-2 cache, the lengths of the wires and connections become smaller. As a result, a latency time of the processor is much reduced. The width of access can be considerably enlarged, because a number of connections can be ensured as a result of the low-profile chip carriers 450 and 451-1 to 451-n and smaller pitches between the direct through-hole connections 441-1 to 441-n and the through-hole connections 470.

Input and output signals between the microprocessor, the level-2 cache, and the outside of the module are transmitted through the direct through-hole connections 440 and 441-1 to 441-n, the substrates 420 and 421-1 to 421-n, the through-hole connections 470, the substrate 480, and the input/output pins 490. Variations in supply voltage caused by the simultaneous changeover current noise of an output circuit is reduced to a level where the noise will not result in an operation failure, because the capacitor film 511 acts as a decoupling capacitor.

Compared with the chips 411-1 to 411-n that form the level-2 cache, the microprocessor (chip 410) generates a particularly larger amount of heat. Heat developed in the microprocessor principally travels through the inside of the chip 410 from the surface of the chip 410 adjoining to the substrate 420 to the heat conducting substrate 510 via the adhesive layer 460. An air-cooled fin is attached to the heat conducting substrate 510 with grease. Alternatively, the heat conducting substrate 510 itself is processed into a fin structure. As a result, the microprocessor can be efficiently cooled. The heat developed in the level-2 cache transmits the direct through-holes 441-1 to 441-n (thermal through-holes), the substrates 421-1 to 421-n, and the through-hole connections 470. Some of the heat escapes from the heat conducting substrate 510, and some of the heat escapes from the input/output pins 490.

According to the chip connection structure 400 shown in the fourth embodiment, the chip connection structure provides high-density laminate packaging, high-speed data transmission, and highly efficient cooling in addition to low cost, and hence it is possible to provide a compact processor module having superior cost versus performance.

The first to twenty fifth means as previously mentioned in summary bring the following merits.

[1] As a result of the first means, the integrated circuit chip is connected to a wiring substrate by FCDB, and connecting pads of the chip are directly connected to wires of the substrate. Resultantly reduced area and thickness of the chip lead to high-density packaging of the chip. The minute two-dimensional array connection permits the chip to effect a plurality of high-density inputs and outputs, and the short interconnection directly connected to the chip permits high-speed signal transmission. High reliability is ensured as a result of preventing the concentration of stress, and inexpensive assembly of the chip module can be carried out by means of simple processes and facilities. These merits have never been realized by any one of the conventional technologies, that is, WB, TAB, FCSB, and HDI. It is evident that the chip connection structure of the present invention provides high practicability in excess of the practicability of the conventional technology.

[2] As a result of the second means, a plurality of direct through-hole connections which directly connect the connecting pads to the wires of the substrate are formed directly below the pads so as to pass through the substrate by simple plating by one operation, which results in improved process throughput and reduced facility costs.

[3] As a result of the third means, polymer which is common industrial material and provides a wide range of selection for material design is used for the substrate. Similarly, general-purpose polymer is also used as the adhesive film for use in connecting a chip to the substrate by means of FCDB. Therefore, an investment for infrastructure can be reduced, and the connection structure can correspond to a wide variety of specifications.

[4] As a result of the fourth means, a solid adhesive film is fed prior to FCDB processes, and FCDB is effected by simple heating. For these reasons, the handling and process management of the adhesive film become simple, which in turn results in reduced cost.

[5] As a result of the fifth means, positioning tolerance between the through-holes for direct through-hole connections and the connecting pads of the chip becomes larger, and it becomes possible to prevent a short circuit of the direct through-hole connections and the deterioration of the areas in the vicinity of the pads, thereby resulting in improved yield.

[6] As a result of the sixth means, the metallization of the minute direct through-hole connections that pass through the substrate becomes easy, and the processes of the metallization are facilitated. By virtue of them, connection failures of the direct through-hole connections are reduced, thereby resulting in improved yield.

[7] As a result of the seventh means, a signal is transmitted over the wires and direct through-hole connections that are made of copper having low resistance and pass through the polyimide substrate having a low dielectric constant, and hence transmission delay of the signal is reduced, and the waveform of the signal is prevented from being deteriorated, thereby resulting in higher transmission of the signal.

[8] As a result of the eighth means, thermal stress caused by a difference in coefficient of thermal expansion between the chip and the substrate is reduced. The improved reliability of the bonding in FCDB and the direct through-hole connections is ensured over a long period of time against temperature variations.

[9] As a result of the ninth means, the adhesive film alleviates thermal stress or external stress exerted on the chip and the substrate, and hence the occurrence of FCDB failures or defective direct through-hole connections can be prevented.

[10] As a result of the tenth means, a plurality of chips can be bonded to one large and inexpensive substrate by FCDB, and finer direct through-hole connections can be formed on smaller pitches. This permits the mass-production of the chip connection structure, and therefore a capital investment can be redeemed in a short period of time.

[11] As a result of the eleventh means, the coplanar transmission line formed on the opposite surface of the substrate to the chip enables high-speed signal transmission. The exposed wire provides easy check.

[12] As a result of the twelfth means, the microstrip transmission lines formed on both surfaces of the substrate enable the high-speed transmission of a larger number of signals.

[13] As a result of the thirteenth means, the use of the multilayer wiring board which may incur slight additional cost results in a chip connection structure having a higher degree of freedom with respect to the wiring density and the connection density of the direct through-holes.

[14] As a result of the fourteenth means, portions of the chip which are irrelevant to circuit operation are removed, thereby resulting in improved density in terms of a packaging volume as well as a packaging density of the chip connection structure.

[15] As a result of the fifteenth means, the insulator layer of the silicon-on-insulator wafer acts as an etch stopper, as a result of which a ultra-thin chip connection structure is obtained without damaging the chip.

[16] As a result of the sixteenth means, athe chip is sealed by easy coating, and additional packaging is not necessitated for reducing parts number. Reliability of chip connection is improved.

[17] In the multilayer chip connection structure based on the seventeenth means, the chip is connected to the chip carrier substrate by FCDB and the direct through-hole connections, and the chip carriers stacked by the adhesive films are connected to each other through through-hole connections. The resultantly obtained low-profile laminate multichip provides considerably improved packaging density. The minute chip connections and the interlayer connections provide high-density inputs and outputs. The interconnection in proximity to the chip implements higher-speed signal transmission. The dispersion of the stress exerted between the chip and the carrier provides improved reliability. The industrial multilayer processes implement low-cost assembly of a module. These merits have never been attained by a laminate produced by the conventional technologies, that is, WB, TAB, FCSB, and HDI.

[18] As a result of the eighteenth means, a plurality of inputs and outputs are two-dimensionally obtained from the bottom of the package which is sealed by simple coatings. Hence, a pin density and reliability of the multilayer chip connection structure are improved.

[19] As a result of the nineteenth means, a larger number of inputs and outputs are easily obtained by the ball grid array arranged on an inexpensive printed board, thereby resulting in reduced costs and improved pin density.

[20] As a result of the twentieth means, the input and output leads are drawn without the use of the package base, thereby resulting in a reduced number of parts and a ultra-low-profile laminate package.

[21] As a result of the twenty-first means, wires for supplying address, data, and feeding between stacked memory chips are provided in the through-hole connections having a small area, thereby resulting in a compact memory module.

[22] As a result of the twenty-second means, memory is disposed very close to the microprocessor, thereby resulting in high-speed access and large capacity. It is possible to implement a high-performance compact processor module.

[23] As a result of the twenty-third means, a signal input to the chip is terminated by the terminating resistor circuit chip connected to the laminate. Therefore, it is possible to prevent an error of the circuit caused by reflection noise.

[24] As a result of the twenty-fourth means, the capacitor film connected to the laminate acts as a decoupling capacitor of the power-supply line, and hence it is possible to suppress variations in supply voltage resulting from the simultaneous switch noise of the chip.

[25] As a result of the twenty-fifth means, the chip is cooled by the heat conducting substrate stacked together with the chip, and hence it is possible to prevent operation failures caused by a temperature rise.

What is claimed is:

1. Chip connection structure comprising:

an integrated circuit chip having an integrated circuit and connecting pads;

a wiring substrate film having wires;

an adhesive film for connecting said integrated circuit chip to said wiring substrate film by flip chip die bonding;

through-holes extending continuously through both said wiring substrate film and said adhesive film; and through-hole conductors extending in said through-holes, which pass through said adhesive film and said wiring substrate film and directly connect said connecting pads to said wires, wherein said through-holes are through-holes formed by adhering the adhesive film to the wiring substrate film and, prior to adhering the integrated circuit chip to the adhesive film but after adhering the adhesive film to the wiring substrate film, forming the through-holes through both the adhesive film and the wiring substrate film, and wherein said through-holes have a diameter of less than the size of the connecting pads, and a thickness of said wiring substrate film is less than twice the diameter of the through-holes.

2. Chip connection structure as defined in claim 1, wherein said through-hole conductors are conductors formed by plating.

3. Chip connection structure as defined in claim 1, wherein said wiring substrate film is made of a polymer base material, and said adhesive film is made of a polymer base material.

4. Chip connection structure as defined in claim 1, wherein said adhesive film includes a polymer film having such a thermosetting property and fluidity when heated that the integrated circuit chip can be attached to the adhesive film fixed to the wiring substrate film after the through-holes have been formed, without crushing the through-holes.

5. Chip connection structure as defined in claim 4, wherein said fluidity and said thermosetting property enables said integrated circuit chip to be fixed to said adhesive film adhered to said wiring substrate film in such a manner that (a) said integrated circuit chip is placed into contact with said adhesive film adhered to said wiring substrate film, after the through-holes have been formed, (b) said integrated circuit chip fixed to said adhesive film adhered to said wiring substrate film is heated to a temperature which softens said adhesive film due to said fluidity of said adhesive film, and thereafter (c) said adhesive film is set due to the thermosetting property of said adhesive film.

6. Chip connection structure as defined in claim 1, wherein said adhesive film is made of a film comprising a mixture of polyimide and bis-maleimide.

7. Chip connection structure as defined in claim 6, wherein said wiring substrate film is made of a polyimide film.

8. Chip connection structure as defined in claim 1, wherein said wiring substrate film is substantially the same in coefficient of thermal expansion as said integrated circuit chip.

9. Chip connection structure as defined in claim 1, wherein said adhesive film has lower rigidity than the rigidity of said integrated chip and said wiring substrate film.

10. Chip connection structure as defined in claim 1, wherein said wiring substrate film is made of one layer and said wires are formed on at least one of the surfaces of said wiring substrate film.

11. Chip connection structure as defined in claim 10, wherein coplanar signal lines are formed on the opposite surface of said wiring substrate film in relation to said integrated circuit chip.

12. Chip connection structure as defined in claim 10, wherein feed lines are formed on one surface of said wiring substrate film and microstrip signal lines are formed on the other surface of the same.

13. Chip connection structure as defined in claim 1, wherein said wiring substrate film a multilayer wiring film.

14. Chip connection structure as defined in claim 1, wherein said integrated circuit chip is an integrated circuit chip formed from a wafer which includes said integrated circuit and said connecting pads on one of two opposed surfaces of the wafer, after the wafer has been processed so as to reduce thickness of the wafer from its opposite surface side in relation to the side on which said integrated circuit and said connecting pads are provided, by mechanical polishing or chemical etching.

15. Chip connection structure as defined in claim 14, wherein said integrated circuit chip is made up of a silicon-on-insulator chip.

16. chip connection structure as defined in claim 1, further comprising
    input/output leads connected to part of said wires; and
    a coating for surrounding said integrated circuit chip and at least a part of said adhesive film.

17. Chip connection structure including:
    a plurality of chip carriers,
    first adhesive films for stacking said chip carriers,
    first through-holes extending continuously through both said plurality of chip carriers and said first adhesive films, and
    first through-hole conductors which pass through said chip carriers and said first adhesive films, wherein each chip carrier comprises:
        an integrated circuit chip having connecting pads;
        a wiring substrate having first wires which are connected to said first through-hole conductors;
        a second adhesive film for connecting said integrated circuit chip to said wiring substrate by flip chip die bonding;
        second through-holes extending continuously through both said wiring substrate and said second adhesive films; and
        second through-hole conductors which pass through said second adhesive film and said wiring substrate and directly connect said connecting pads to said first wires.

18. Chip connection structure as defined in claim 17, further comprising:
    a package base having second wires and input/output pins connected to said second wires;
    a third adhesive film connecting said package base to said chip carriers; and
    a coating which surrounds said chip carriers and at least a part of said package base,
    wherein each of said first through-hole conductors directly connects two of (a) at least one of said first wires included in at least one of said plurality of chip carriers, (b) at least one of said first wires included in at least another one of said plurality of chip carriers, and (c) at least one of said second wires.

19. Chip connection structure as defined in claim 18, wherein said input/output pins are made of a ball grid array.

20. Chip connection structure as defined in claim 17, further comprising:
    input/output leads connected to said first wires included in at least one of said plurality of chip carriers; and
    a coating which surrounds said plurality of chip carriers and a part of said input/output leads.

21. Chip connection structure as defined in claim 17, wherein said integrated circuit chip included in at least one of said plurality of chip carriers is made up of a memory chip.

22. Chip connection structure as defined in claim 21, wherein said integrated circuit chip included in at least one of said plurality of chip carriers is made up of a microprocessor chip.

23. Chip connection structure as defined in claim 17, wherein said integrated circuit chip included in at least one of said plurality of chip carriers is made up of a terminating resistor circuit chip.

24. Chip connection structure as defined in claim 17, wherein the plurality of chip carriers provide a stack of the plurality of chip carriers, the structure further comprising a capacitor film disposed at one of the upper, lower, or middle portions of the stack of said plurality of chip carriers.

25. Chip connection structure as defined in claim 17, wherein the plurality of chip carriers provide a stack of chip carriers, the structure further comprising a thermal conductive substrate disposed at one of the upper, lower, and middle portions of the stack of said chip carriers.

26. Chip connection structure comprising:
    an integrated circuit chip having an integrated circuit and connecting pads;
    a wiring substrate film having wires;
    an adhesive film for connecting said integrated circuit chip to said wiring substrate film by flip chip die bonding;
    through-holes extending continuously through both said wiring substrate film and said adhesive film; and
    through-hole conductors extending in said through-holes, which pass through said adhesive film and said wiring substrate film and directly connect said connecting pads to said wires,
    wherein said through-holes have a diameter of less than the size of said connecting pads, and a thickness of said wiring substrate film is less than twice the diameter of the through-holes.

27. Chip connection structure as defined in claim 26, wherein said through-hole conductors are conductors formed by plating.

28. Chip connection structure as defined in claim 26, wherein said wiring substrate film is made of polymer base material, and said adhesive film is made of polymer base material.

29. Chip connection structure as defined in claim 28, wherein said adhesive film is made of a film comprising a mixture of polyimide and bis-maleimide.

30. Chip connection structure as defined in claim 29, wherein said wiring substrate film is made of a polyimide film.

31. Chip connection structure as defined in claim 26, wherein said wiring substrate film is made of one layer, and said wires are formed on at least one of the surfaces of said wiring substrate film.

32. Chip connection structure as defined in claim 26, wherein said adhesive film comprises a polymer film having fluidity which appears when heated and a thermosetting property, wherein said fluidity and said thermosetting property enable said integrated circuit chip to be fixed to a combination of said adhesive film and said substrate, after the through-holes have been formed, without crushing the through-holes.

33. Chip connection structure as defined in claim 22, wherein said fluidity and said thermosetting property enables said integrated circuit chip to be fixed to said combination of said adhesive film and said substrate in such a manner that (a) said integrated circuit chip is placed into contact with said combination of said adhesive film and said substrate, after the through-holes have been formed, (b) a total combination of said integrated circuit chip and said combination of said adhesive film and said substrate is heated to a temperature which softens said adhesive film due to said fluidity of said adhesive film, and thereafter (c) said adhesive film is set due to the thermosetting property of said adhesive film.

\* \* \* \* \*